(12) United States Patent
Hollis et al.

(10) Patent No.: US 10,365,833 B2
(45) Date of Patent: Jul. 30, 2019

(54) APPARATUSES AND METHODS FOR ENCODING AND DECODING OF SIGNAL LINES FOR MULTI-LEVEL COMMUNICATION ARCHITECTURES

(71) Applicant: MICRON TECHNOLOGY, INC., Boise, ID (US)

(72) Inventors: Timothy Hollis, Meridian, ID (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 512 days.

(21) Appl. No.: 15/004,777

(22) Filed: Jan. 22, 2016

(65) Prior Publication Data

US 2017/0212695 A1 Jul. 27, 2017

(51) Int. Cl.
*G06F 3/06* (2006.01)
*G06F 13/42* (2006.01)
*G06F 13/40* (2006.01)
*G11C 7/10* (2006.01)

(52) U.S. Cl.
CPC .......... *G06F 3/0613* (2013.01); *G06F 3/0607* (2013.01); *G06F 3/0635* (2013.01); *G06F 13/4022* (2013.01); *G06F 13/4072* (2013.01); *G06F 13/4282* (2013.01); *G11C 7/1072* (2013.01)

(58) Field of Classification Search
None
See application file for complete search history.

(56) References Cited

U.S. PATENT DOCUMENTS

| 5,166,956 | A | * | 11/1992 | Baltus | ................. H04L 25/4917 341/56 |
| 5,446,697 | A | | 8/1995 | Yoo et al. | |
| 5,471,156 | A | * | 11/1995 | Kim | ................. H03K 19/0823 326/60 |
| 5,770,967 | A | | 6/1998 | Alzati et al. | |
| 5,856,980 | A | * | 1/1999 | Doyle | ................. H03M 5/20 375/264 |

(Continued)

FOREIGN PATENT DOCUMENTS

| CN | 105247791 A | 1/2016 |
| TW | I343058 B1 | 6/2011 |

(Continued)

OTHER PUBLICATIONS

'A Low-Complexity Power-Efficient Signaling Scheme for Chip-To-Chip Communication' by Kamran Farzan and David A. Johns, 2003, IEEE.*

(Continued)

*Primary Examiner* — Steven G Snyder
(74) *Attorney, Agent, or Firm* — Dorsey & Whitney LLP

(57) ABSTRACT

Apparatuses and methods for multi-level communication architectures are disclosed herein. An example apparatus may include a driver circuit configured to convert a plurality of bitstreams into a plurality of multilevel signals. A count of the plurality of bitstreams is greater than count of the plurality of multilevel signals. The driver circuit further configured to drive the plurality of multilevel signals onto a plurality of signal lines using individual drivers. A driver of the individual drivers is configured to drive more than two voltages.

30 Claims, 13 Drawing Sheets

(56) References Cited

U.S. PATENT DOCUMENTS

| | | | |
|---|---|---|---|
| 5,917,340 A * | 6/1999 | Manohar | H03K 19/09425 326/27 |
| 6,140,841 A * | 10/2000 | Suh | H03M 13/00 326/59 |
| 6,208,575 B1 | 3/2001 | Proebsting | |
| 6,324,602 B1 * | 11/2001 | Chen | G11C 11/56 341/56 |
| 6,518,893 B1 * | 2/2003 | Robinson | H03M 5/20 341/56 |
| 6,745,316 B1 * | 6/2004 | Yang | G11C 11/56 711/1 |
| 7,224,737 B2 * | 5/2007 | Voutilainen | H04L 7/06 332/115 |
| 7,263,148 B2 * | 8/2007 | Chang | H04B 5/0012 375/145 |
| 8,026,740 B2 | 9/2011 | Hollis | |
| 8,363,707 B2 | 1/2013 | Hollis | |
| 8,436,653 B2 | 5/2013 | Hollis | |
| 8,594,262 B2 * | 11/2013 | Slezak | H03M 9/00 375/353 |
| 8,737,456 B2 | 5/2014 | Hollis | |
| 8,781,022 B1 * | 7/2014 | Chang | H04L 25/4923 375/286 |
| 8,854,236 B2 | 10/2014 | Hollis | |
| 9,112,550 B1 * | 8/2015 | Ulrich | H04B 3/04 |
| 9,116,828 B2 | 8/2015 | Hollis | |
| 9,263,107 B1 * | 2/2016 | Wayland | G11C 7/1051 |
| 9,464,918 B2 * | 10/2016 | Klode | G01D 5/142 |
| 9,831,873 B2 * | 11/2017 | Stoica | G06F 7/00 |
| 9,917,711 B2 * | 3/2018 | Ulrich | H04L 25/03878 |
| 9,979,354 B2 * | 5/2018 | Hoyerby | H03F 3/2173 |
| 2002/0084833 A1 | 7/2002 | Kim et al. | |
| 2003/0156101 A1 | 8/2003 | Lechevalier | |
| 2003/0205974 A1 | 11/2003 | Kuehner et al. | |
| 2003/0214347 A1 | 11/2003 | Nuzzarello et al. | |
| 2004/0066225 A1 | 4/2004 | Seo | |
| 2004/0110519 A1 * | 6/2004 | Chang | H04B 5/0012 455/502 |
| 2004/0207329 A1 | 10/2004 | Kudo et al. | |
| 2005/0078712 A1 * | 4/2005 | Voutilainen | H04L 7/06 370/516 |
| 2005/0220232 A1 * | 10/2005 | Kunnari | H04L 25/4923 375/353 |
| 2007/0183205 A1 | 8/2007 | Lee | |
| 2008/0068070 A1 | 3/2008 | Lee et al. | |
| 2008/0150620 A1 | 6/2008 | Lesso | |
| 2008/0304335 A1 | 12/2008 | Shin et al. | |
| 2009/0059712 A1 | 3/2009 | Lee et al. | |
| 2009/0122593 A1 | 5/2009 | Cho et al. | |
| 2009/0167425 A1 | 7/2009 | Park | |
| 2009/0184239 A1 | 7/2009 | Jeong et al. | |
| 2009/0238300 A1 * | 9/2009 | Hollis | H03K 19/0002 375/287 |
| 2009/0273362 A1 | 11/2009 | Fairbanks | |
| 2009/0313521 A1 | 12/2009 | Hollis | |
| 2010/0026533 A1 | 2/2010 | Hollis | |
| 2010/0289556 A1 | 11/2010 | Byeon | |
| 2011/0001534 A1 | 1/2011 | Chuang et al. | |
| 2011/0012521 A1 | 1/2011 | Byun et al. | |
| 2011/0012671 A1 | 1/2011 | Chuang et al. | |
| 2011/0102208 A1 * | 5/2011 | Terashima | H03M 5/20 341/67 |
| 2011/0316618 A1 | 12/2011 | Bergler et al. | |
| 2012/0249636 A1 | 10/2012 | Kitabayashi | |
| 2013/0043900 A1 | 2/2013 | Hollis et al. | |
| 2013/0278296 A1 | 10/2013 | Amirkhany et al. | |
| 2013/0301750 A1 * | 11/2013 | Chang | H04L 25/4917 375/286 |
| 2014/0101349 A1 | 4/2014 | Engl | |
| 2014/0269140 A1 | 9/2014 | Sanjeevarao et al. | |
| 2014/0297986 A1 | 10/2014 | Lee | |
| 2014/0313836 A1 | 10/2014 | Pan et al. | |
| 2015/0002408 A1 | 1/2015 | Mozak et al. | |
| 2015/0022383 A1 | 1/2015 | Hollis | |
| 2015/0061738 A1 | 3/2015 | Kwon et al. | |
| 2015/0097598 A1 * | 4/2015 | Cronin | H03K 17/18 327/109 |
| 2015/0171836 A1 | 6/2015 | Lee | |
| 2015/0177754 A1 | 6/2015 | Mengad et al. | |
| 2015/0187441 A1 | 7/2015 | Hollis | |
| 2015/0345993 A1 * | 12/2015 | Klode | G01D 5/142 324/207.2 |
| 2016/0065211 A1 | 3/2016 | Hsu | |
| 2016/0087633 A1 | 3/2016 | Zhang et al. | |
| 2016/0094224 A1 | 3/2016 | Tamura | |
| 2016/0308533 A1 | 10/2016 | Hsu et al. | |
| 2016/0363461 A1 * | 12/2016 | Klode | G01D 5/142 |
| 2017/0039981 A1 | 2/2017 | Hwang et al. | |
| 2017/0062055 A1 | 3/2017 | Polizzi et al. | |
| 2017/0131327 A1 | 5/2017 | Ullmann et al. | |
| 2017/0365331 A1 | 12/2017 | Chanana et al. | |
| 2018/0006643 A1 | 1/2018 | Schulmeyer et al. | |
| 2018/0053558 A1 | 2/2018 | Tanzawa | |
| 2018/0109255 A1 | 4/2018 | Lee | |
| 2018/0123451 A1 | 5/2018 | Larsen et al. | |
| 2018/0145681 A1 | 5/2018 | Foley et al. | |

FOREIGN PATENT DOCUMENTS

| | | |
|---|---|---|
| TW | 201411636 A | 3/2014 |
| WO | 2019018530 A1 | 1/2019 |

OTHER PUBLICATIONS

'Low-Power Bus Transform Coding for Multilevel Signals' by Fakhrul Zaman Rokhani and Gerald E. Sobelman, 2006, IEEE.*

'Design and Characterization of a Multilevel DRAM' by John C. Koob et al., IEEE Transactions on Very Large Scale Integration (VLSI) Systems, vol. 19, No. 9, Sep. 2011.*

'A 3-Level Asynchronous Protocol for a Differential Two-Wire Communication Link' by Christer Svensson and Jiren Yuan, IEEE Journal of Solid-State Circuits. vol. 29. No. 9, Sep. 1994.*

'A Multi-Level DRAM with Fast Read and Low Power Consumption' by Bo Liu et al., 2005, IEEE.*

'A Novel Compact Circuit for 4-PAM Energy-Efficient High Speed Interconnect Data Transmission and Reception' by Uygar E. Avci and Sandip Tiwari, Microelectron. J., vol. 36, No. 1, pp. 67-75, Jan. 2005.*

'Low Power Design of Bus Communication' dissertation by Fakhrul Zaman Rokhani, Nov. 2008. (Year: 2008).*

'A Low-Power 4-PAM Transceiver Using a Dual-Sampling Technique for Heterogeneous Latency-Sensitive Network-on-Chip' by Gyung-Su Byun and M. M. Navidi, IEEE Transactions on Circuits and System—II: Express Briefs, vol. 62, No. 6, Jun. 2015. (Year: 2015).*

'A 56Gb/s PAM-4 VCSEL driver circuit' by N. Quadir et al., ISSC 2012, NUI Maynooth, Jun. 28-29, 2012.*

'A 0.18-μm CMOS 10-Gb/s Dual-Mode 10-PAM Serial Link Transceiver' by Bongsub Song et al., IEEE Transactions on Circuits and Systems—I: Regular Papers, vol. 60, No. 2, Feb. 2013. (Year: 2013).*

Receipt of ISRWO for application No. PCT/US2016/069425 dated Apr. 14, 2017.

First Office Action dated Sep. 28, 2017 for Taiwanese Application No. 106102265.

U.S. Appl. No. 15/783,688, entitled 'Apparatuses and Methods for Providing Additional Drive to Multilevel Signals Representing Data', filed Oct. 13, 2017.

International Search Report and Written Opinion dated Oct. 29, 2018 for PCT Application No. PCT/US2018/042698, 16 pages.

U.S. Appl. No. 16/375,770, titled "Apparatuses and Methods for Providing Additional Drive to Multilevel Signals Representing Data", filed Apr. 4, 2019, pp. all.

* cited by examiner

APPARATUSES AND METHODS FOR ENCODING AND DECODING OF SIGNAL LINES FOR MULTI-LEVEL COMMUNICATION ARCHITECTURES

BACKGROUND

The pursuit of making computing systems more powerful and more power efficient has led to advancement in interface communications to improve throughput without increasing, and ideally reducing, energy consumption. Often, as clock speeds increase, a desire to increase data transition times on interface busses to match the faster clock speeds exists. Future double data rate (DDR) dynamic random-access memory (DRAM) performance targets will soon exceed DRAM transistor switching capabilities. Some systems have implemented data encoding and special purpose, multi-level (e.g., more than two levels) bus architectures to increase throughput over an interface bus. However, these special purpose architectures increase cost and complexity, and require additional input/output (I/O) pins.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
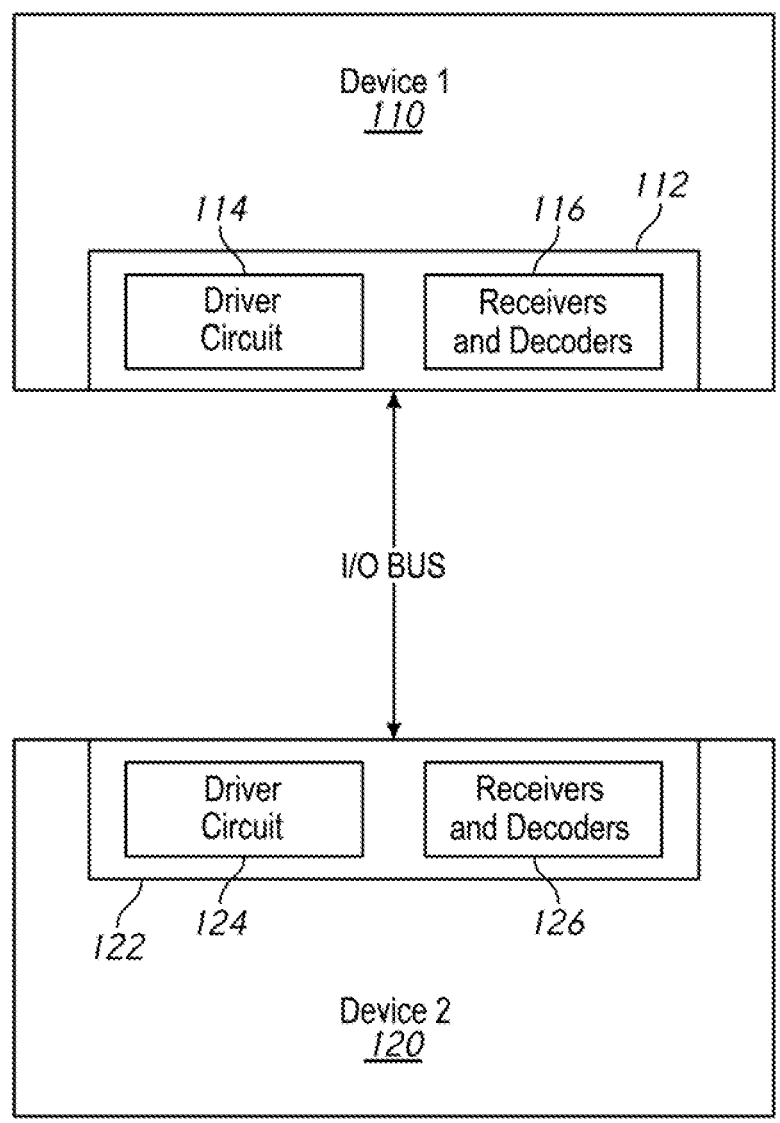
FIG. 1 is a block diagram of an apparatus according to an embodiment of the present disclosure.

FIG. 1 is a block diagram of an apparatus 100 according to an embodiment of the present disclosure. The apparatus 100 may include a first device 110 that communicates with a second device 120 over an input/output (I/O) bus. The first device 110 may include an I/O interface circuit 112 that includes driver circuit 114 and receiver and decoder circuit 116 for communication over the I/O bus. The second device 120 may include an I/O interface circuit 122 that includes driver circuit 124 and receiver and decoder circuit 126 for communication over the I/O bus. The I/O bus may support a multi-level communication architecture that includes a plurality of channels. In some embodiments, each channel may be single-ended and may include a single signal line. In other embodiments, each channel may include more than one signal line. In one embodiment, the first device 110, the second device 120, and the I/O bus may support a channel that includes conversion of M bitstreams to N multilevel signals, where M is greater than N. A bitstream includes a plurality of bits provided serially, wherein each bit of the bitstream is provided over a period of time. For example, a first bit is provided for a first period, and a second bit is provided for a second period following the first period, and a third bit is provided for a third period following the second period, and so on. The successive bits provided in this serial manner represent a stream of bits. The N multilevel signals may be transmitted over the I/O bus. In one example, 3 bit streams may be converted to 2 tri-level signals. In another example, pulse-amplitude modulation (PAM) may be used to convert 2, 3, or 4 bitstreams into a single multilevel signal having (e.g., 4, 8, 16, etc., levels). In some examples, the first device 110 may include a memory controller or processing system and/or the second device 120 may include a memory, including volatile memory and/or non-volatile memory. In some examples, the second device 120 may include a dynamic random access memory (DRAM), such as a double-data-rate (DDR) DRAM or a low power DDR DRAM. It should be noted, however, that a memory is not a necessary component of the disclosure. Rather, the disclosure may be applied to any two or more devices, on or off-chip, that communicate with one another using multilevel signaling.

The driver circuit 114 may include circuitry that applies a bitstream conversion to a set of M bitstreams to generate N multilevel signals and drives the N multilevel signals as channels on the I/O bus. Similarly, the driver circuit 124 may include circuitry that applies a bitstream conversion to a set of M bitstreams to generate N multilevel signals and drives the N multilevel signals as channels on the I/O bus. In some examples, the driver circuit 114 may include modifications to existing DDR drivers to drive the multilevel signals onto the channels of the I/O bus.

For each channel, the receiver and decoder circuit 116 may include decoders configured to recover the set of M bitstreams by decoding the N multilevel signals received via the channels of the I/O bus as provided by the driver circuit 124. Further, the receiver and decoder circuit 126 may include decoders configured to recover the set of M bitstreams by decoding the N multilevel signals received via the channels of the I/O bus as provided by the driver circuit 114. In some embodiments, the receiver and decoder circuit 116 and the receiver and decoder circuit 126 may include comparators and decoding logic to recover the set of M bitstreams.

In operation, the first device 110 and the second device 120 may communicate over the I/O bus to transfer information, such as data, addresses, commands, etc. While the I/O bus is shown to be bidirectional, the I/O bus may also be a unidirectional bus. The I/O interface circuit 112 and I/O interface circuit 122 may implement a multi-level communication architecture. In a multi-level communication architecture, a symbol is sent over a channel during a symbol period. A symbol may be a single value on a signal line of a channel, or may be a combination of values provided on a plurality of signal lines of a channel. The symbol may represent a channel state. A receiver may determine an output signal value based on the value transmitted on the signal line(s) of a channel. In a single-ended architecture, the signal line value may be compared against one or more reference values to determine the output signal value. A receiver has a time period to determine and latch the output signal value from the time the output signal transitions to the current value to the time the output signal transitions to the next value. The transition time may be determined based on a clock signal, as well as a setup and hold time based on a transition from one value to another. In a multi-level communication architecture with a fixed slew rate or fixed rise/fall times, inherent jitter may occur due to differing magnitude shifts (e.g., from VH to VL vs. from VMID to VH or VL). The amount of jitter may be based on the slew rate, the rise/fall times, the multi-level magnitudes values, or combinations thereof. In some examples, the transition times may also be affected by process, voltage, and temperature variations.

In an example, the driver circuit 114 may generate a symbol for a channel by converting a bit from each of M bitstreams into N multilevel signals. The symbol may be transmitted to the receiver and decoder circuit 126 via N signal lines of the I/O bus. The receiver and decoder circuit 126 may detect levels on the N signal lines and decode the levels to retrieve the bit from each of the M streams. By using multilevel signal lines, more data can be transmitted during a symbol period as compared with using binary signal line levels. In an example, M is 3 and N is 2, and the signal lines of the I/O bus are capable of being driven to three independent levels. In another example, M is 2 and N is 1, and the signal lines of the I/O bus are capable of being driven to four independent levels (e.g., in a PAM implementation). Communication protocol between the driver circuit 124 and the receiver and decoder circuit 116 may be similar to the communication protocol between the encoder and driver circuit 114 and the receiver and decoder circuit 126. The driver circuit 114 may include a DRAM driver that has been segmented to drive multiple (e.g., more than 2) voltage levels on a signal line.

Figure 2:
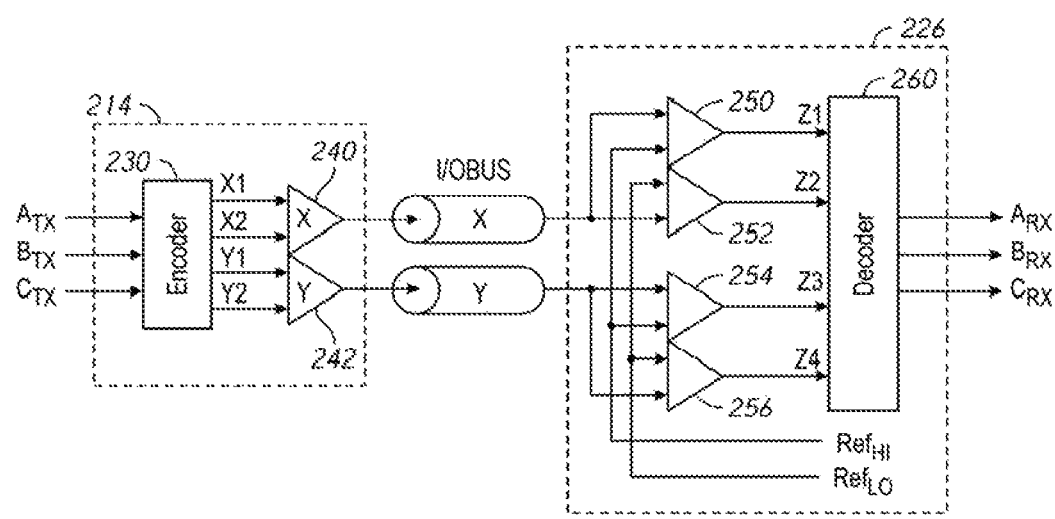
FIG. 2 is a block diagram of an apparatus for a multilevel communication architecture including a pair of signal lines according to an embodiment of the present disclosure.
Figure 3A:
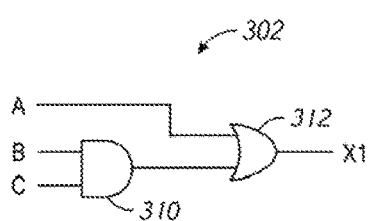
FIGS. 3A-3D are schematic drawings of logic circuits for encoding multilevel signals according to an embodiment of the present disclosure.
Figure 3C:
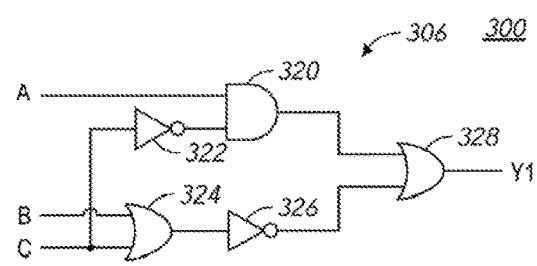
Figure 3B:
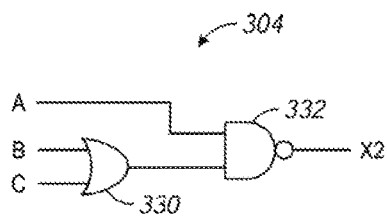
Figure 3D:
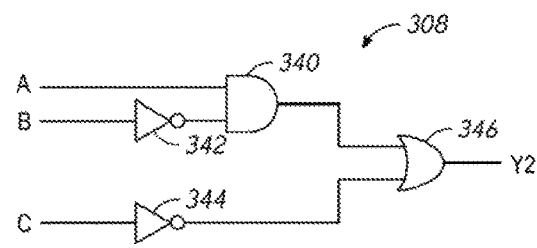

FIG. 2 is a block diagram of an apparatus 200 for a multilevel communication architecture including a pair of signal lines according to an embodiment of the present disclosure. The apparatus 200 may include a signal driver 214 coupled to a receiver 226 via an I/O bus. The signal driver 214 may be implemented in the driver circuit 114 and/or the driver circuit 124 of FIG. 1 and the receiver 226 may be implemented in the receiver and decoder circuit 116 and/or the receiver and decoder circuit 126 of FIG. 1.

The signal driver 214 may include an encoder 230 coupled to a driver 240 and a driver 242. The encoder 230 may be configured to receive bitstreams ATX, BTX, and CTX. The encoder 230 may encode the ATX, BTX, and CTX to provide X1, X2, Y1, and Y2 control signals. The driver 240 may receive the X1 and X2 control signals and may drive a voltage on an X signal line of the I/O bus based on the X1 and X2 control signals. The driver 242 may receive the Y1 and Y2 control signals and may drive a voltage on a Y signal line of the I/O bus based on the Y1 and Y2 control signals. Thus, the signal driver 214 may convert ATX, BTX, and CTX bitstreams into two multilevel signals to be driven over the I/O bus.

The receiver 226 may include comparators 250, 252, 254, and 256 coupled to a decoder 260. The comparators 250 and 252 may be configured to receive the signal from the X signal line of the I/O bus and the comparators 254 and 256 may be configured to receive the signal from the Y signal line of the I/O bus. The comparator 250 may compare the signal of the X signal line to a high reference signal HIREF to provide a Z signal to the decoder 260. The comparator 252 may compare the signal of the X signal line to a low reference signal LOREF to provide a Z2 signal to the decoder 260. The comparator 254 may compare the signal of the Y signal line to the HIREF signal to provide a Z3 signal to the decoder 260. The comparator 254 may compare the signal of the Y signal line to the LOREF signal to provide a Z4 signal to the decoder 260. The decoder 260 may include logic to generate ARX, BRX, and CRX bitstreams based on the Z1, Z2, Z3, and Z4 signals from the comparators 250, 252, 254, and 256, respectively. The ARX, BRX, and CRX signals may be logical equivalents of data transmitted by the ATX, BTX, and CTX signals.

In operation, the ATX, BTX, and CTX signals may be three bitstreams to be transmitted over the I/O bus. Rather than send each bitstream on a separate signal line, the signal driver 214 may encode the ATX, BTX, and CTX signals to be transmitted over two signal lines using multilevel signals. For example, the encoder 230 may receive the ATX, BTX, and CTX signals, and during each symbol period, may encode a symbol in the form of the X1, X2, Y1, and Y2 control signals to control the drivers to drive the pair of signal lines of the I/O bus to respective voltages. While the embodiment illustrated in FIG. 2 is provided the three bitstreams ATX, BTX, and CTX, which are merged through encoding, in other embodiments one bit stream may be provided and three sequential bits may be provided as three bits of data for encoding. For example, every third bit of data from the bitstream may be provided as a first bit of data, every third bit of data of a following bit may be provided as a second bit of data, and every third bit of a yet another following bit may be provided as a third bit of data to provide three bits of data for encoding from one bitstream.

The encoder 230 may include control logic to provide each of the X1, X2, Y1, and Y2 control signals. FIG. 3 depicts exemplary logic 300 that may be implemented in the encoder 230 to provide the X1, X2, Y1, and Y2 control signals. For example, the logic 300 may include an X1 logic circuit 302 may be used to provide the X1 control signal. The X1 logic circuit 302 may include a AND gate 310 that is configured to logically AND together the B and C signals and an OR gate 312 that is configured to logically OR the A signal with the output of the AND gate 310 to provide the X1 control signal.

Further, the logic 300 may further include an X2 logic circuit 304 may be used to provide the X2 control signal. The X2 logic circuit 304 may include an OR gate 330 configured to logically OR the B and C signals and a NAND 332 to logically NAND the A signal with the output of the OR gate 330 to provide the X2 control signal.

The logic 300 may include a Y1 logic circuit 306 may be used to provide the Y1 control signal. The Y1 logic circuit 306 may include a AND gate 320 configured to logically AND the A signal and an inverted C signal (via an inverter 322) and an OR gate 324 configured to logically OR the B and C signals. The Y1 logic circuit 306 may further include an OR gate 328 configured to logically OR the output of the AND gate 320 with an inverted (e.g., via an inverter 326) output of the OR gate 324 to provide the Y1 control signal.

The logic 300 may additionally include a Y2 logic circuit 308 may be used to provide the Y2 control signal. The Y2 logic circuit 308 may include an AND gate 340 that is configured to logically AND together the A signal with an inverted (e.g., via inverter 342) B signal and a OR gate 346 that is configured to logically OR the output of the AND gate 340 with an inverted (e.g., via inverter 344) C signal to provide the Y2 control signal.

Turning back to FIG. 2, the driver 240 may drive a voltage on the X signal line of the I/O bus responsive to the X1 and X2 control signals. The driver 242 may drive a voltage on the Y signal line of the I/O bus responsive to the Y1 and Y2 control signals. The voltages driven by the driver 240 and driver 242 may be one of three levels.

Figure 4A:
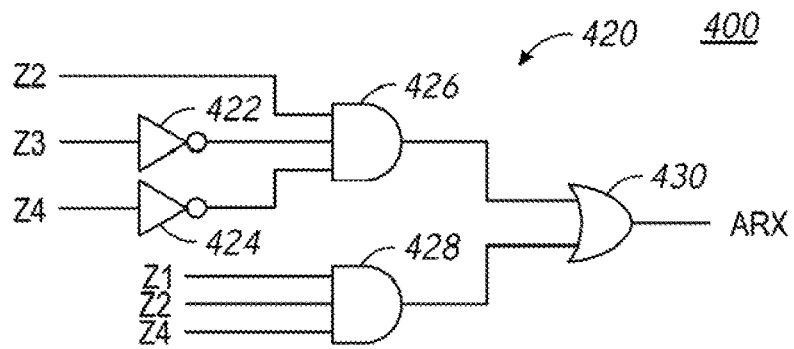
FIGS. 4A-4C are schematic drawings of logic circuits for decoding multilevel signals according to an embodiment of the present disclosure.
Figure 4B:
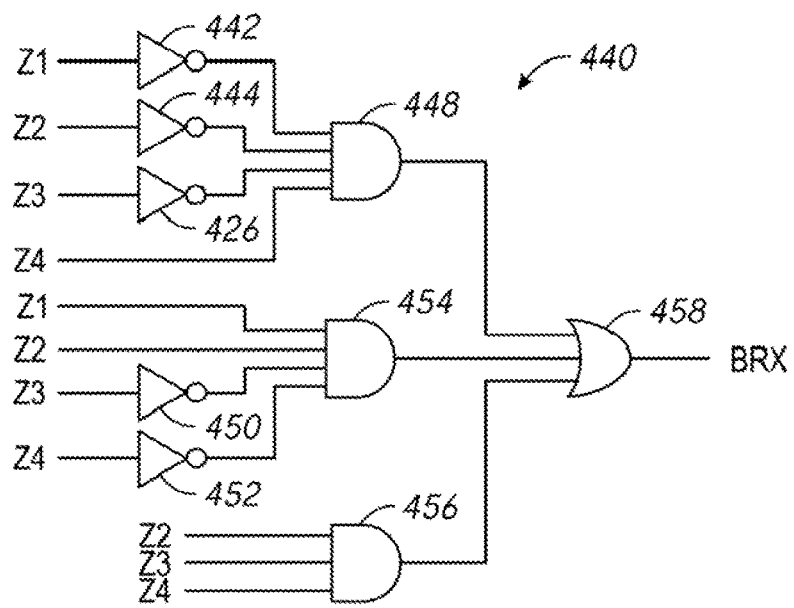
Figure 4C:
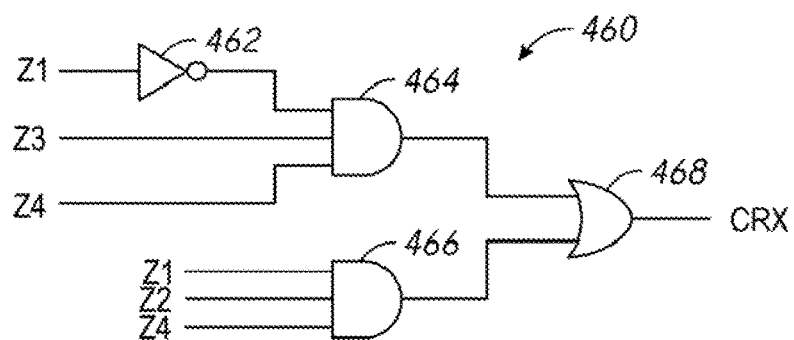

The comparators 250 and 252 may receive the voltage from the X signal line, and the comparators 254 and 256 may receive the voltage from the Y signal line. The comparator 250 may provide the Z1 signal based on the comparison between the voltage of the X signal line with the REFHI voltage. The comparator 252 may provide the Z2 signal based on the comparison between the voltage of the X signal line with the REFLO voltage. The comparator 254 may provide the Z3 signal based on the comparison between the voltage of the Y signal line with the REFHI voltage. The comparator 256 may provide the Z4 signal based on the comparison between the voltage of the X signal line with the REFHI voltage. The decoder 260 may include decoding logic to generate ARX, BRX, and CRX signals based on the Z1, Z2, Z3, and Z4 signals. FIG. 4 depicts exemplary logic 400 that may be implemented in the decoder 260 to provide the ARX, BRX, and CRX control signals. For example, the logic 400 may include an ARX logic circuit 420 that is configured to provide the ARX signal. The ARX logic circuit 420 may include a AND gate 426 and a AND gate 428 coupled in parallel. The AND gate 426 may be configured to logically AND together the Z2 signal, an inverted (via inverter 422) Z3 signal, and an inverted (via inverter 424) Z4 signal. The AND gate 428 may be configured to logically AND the Z1, Z2, and Z4 signals. The ARX logic circuit 420 may further include an OR gate 430 configured to logically OR the output of the AND gate 426 with the output of the AND gate 428 to provide the ARX signal.

The logic 400 may further include a BRX logic circuit 440 that is configured to provide the BRX signal. The BRX logic circuit 440 may include a AND gate 448, a AND gate 454, and an OR gate 458 coupled in parallel. The AND gate 448 may be configured to logically AND together an inverted (via inverter 442) Z1 signal, an inverted (via inverter 444) Z2 signal, an inverted (via inverter 4446) Z3 signal, and the Z4 signal. The AND gate 454 may be configured to logically AND the Z1 signal, the Z2 signal, an inverted (via inverter 450) Z3 signal, and an inverted (via inverter 452) Z4 signal.

The AND gate 456 may be configured to logically AND the Z2, Z3, and Z4 signals. The BRX logic circuit 440 may further include an OR gate 458 configured to logically OR the output of the AND gate 448, the AND gate 454, and AND gate 456 to provide the BRX signal.

The logic 400 may further include a CRX logic circuit 460 that is configured to provide the CRX signal. The CRX logic circuit 460 may include a AND gate 464 and a AND gate 466 coupled in parallel. The AND gate 464 may be configured to logically AND together an inverted (via inverter 462) Z1 signal, the Z3 signal, and the Z4 signal. The AND gate 466 may be configured to logically AND the Z1, Z2, and Z4 signals. The CRX logic circuit 460 may further include an OR gate 468 configured to logically OR the output of the AND gate 464 with the output of the AND gate 466 to provide the CRX signal.

Turning back to FIG. 2, the ARX, BRX, and CRX signals may be provided to downstream circuitry for processing, such as being processed as data to be stored at a memory or as data that has been retrieved from a memory, or as commands or addresses to be decoded and used to perform memory access operations. While FIG. 2 depicts an apparatus 200 that encodes three bitstreams to be transmitted over two multilevel signal lines of an I/O bus, the apparatus 200 may be altered to include additional or less bitstreams, more or less than two signal lines, and an ability to drive more than three voltage levels on each signal line.

Figures 5, 6:
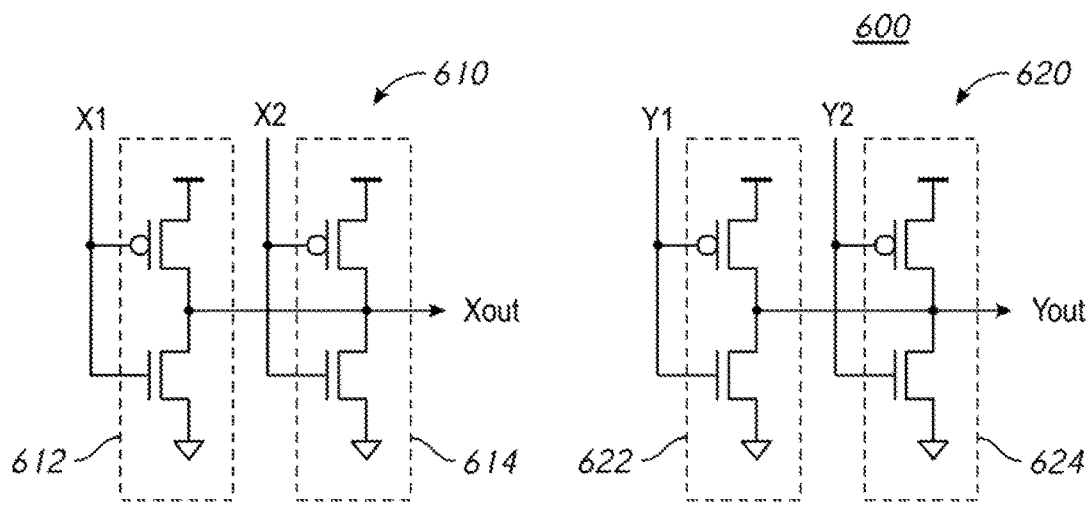
FIG. 5 is an encoding map for encoding three bitstreams on two signal lines that are configured to be driven using a multilevel communication architecture according to an embodiment of the present disclosure.
FIG. 6 is a schematic diagram of drivers for a multilevel communication architecture according to an embodiment of the present disclosure.

FIG. 5 is an encoding map 500 for encoding three bitstreams on two signal lines that are configured to be driven using a multilevel communication architecture according to an embodiment of the present disclosure. The encoding map 500 may be used by the encoder 230 of FIG. 2 to encode the ATX, BTX, and CTX bitstreams to multilevel signals to be driven over the X and Y signal lines of the I/O bus via the driver 240 and the driver 242, respectively. The encoding map 500 includes a first table 510 including possible logical combinations of A, B, and C signals and a second table 520 that includes exemplary unique multilevel encoding of X and Y signal lines for each logical combination of the A, B, and C signal. For example, when the A, B, and C bitstreams each have a logical value of zero (e.g., line 1 of the first table 510), the X and Y signals may be driven to a low voltage. In another example, if the A bitstream has a logical value of zero and the B and C bitstreams have a logical value of one, the X signal may be driven to a middle voltage and Y signal may be driven to a high voltage. It will be appreciated that different mapping may be implemented to encode the A, B, and C signals on the X and Y signals, so long as each unique logical combination of the A, B, and C signals maps to a unique voltage combination on the X and Y signals. For example, the A, B, and C bitstreams having logical values of zero may map to the X and Y signals having high voltages, rather than low voltages, and the A. B, and C bitstreams having logical values of one may map to the X and Y signals having low voltages, rather than high voltages.

FIG. 6 is a schematic diagram of drivers 600 for a multilevel communication architecture according to an embodiment of the present disclosure. The drivers 600 may include an X signal line driver 610 configured to drive an XOUT signal to an X signal line based on X1 and X2 control signals and a Y signal line driver 620 configured to drive the YOUT signal to a Y signal line based on Y1 and Y2 control signals. The X signal line driver 610 may be implemented in the 114 and/or the 124 of FIG. 1 and/or the driver 240 of FIG. 2. The Y signal line driver 620 may be implemented in the 114 and/or the 124 of FIG. 1 and/or the driver 242 of FIG. 2.

The X signal line driver 610 may include an X1 signal line driver 612 and an X2 signal line driver 614 coupled in parallel between a high supply voltage and a low supply voltage. The X signal line driver 612 may be configured to drive a voltage on the XOUT signal responsive to the X1 control signal. For example, the X1 signal line driver 612 may drive the XOUT signal to a high voltage responsive via a pull up (e.g., p-type) transistor responsive to the X1 control signal having a low logical value and may drive the XOUT signal to a low voltage via a pull down (e.g., n-type) transistor responsive to the X1 control signal having a high logical value. Likewise, the X2 signal line driver 614 may be configured to drive the voltage on the XOUT signal responsive to the X2 control signal. For example, the X2 signal line driver 614 may drive the XOUT signal to a high voltage via a pull up transistor responsive to the X2 control signal having a low logical value and may drive the XOUT signal to a low voltage via the pull down transistor responsive to the X2 control signal having a high logical value. The combination of the X1 signal line driver 612 and the X2 signal line driver 614 may drive the XOUT signal to three logical voltage values, e.g., low, mid and high. For example, when both the X1 signal line driver 612 and the X2 signal line driver 614 are driving the XOUT to a high voltage, the XOUT signal may have a high voltage. When both the X1 signal line driver 612 and the X2 signal line driver 614 are driving the XOUT to a low voltage, the XOUT signal may have a low voltage. When one of the X1 signal line driver 612 or the X2 signal line driver 614 are driving the XOUT to a high voltage and the other of the X1 signal line driver 612 or the X2 signal line driver 614 are driving the XOUT to a low voltage, the XOUT signal may have a mid voltage level.

The Y signal line driver 620 may include a Y1 signal line driver 622 and a Y2 signal line driver 624 coupled in parallel between the high supply voltage and the low supply voltage. The Y1 signal line driver 622 may be configured to drive a voltage on the YOUT signal responsive to the Y1 control signal. For example, the Y1 signal line driver 622 may drive the YOUT signal to a high voltage via a pull up transistor responsive to the Y1 control signal having a low logical value and may drive the YOUT signal to a low voltage via a pull down transistor responsive to the Y1 control signal having a high logical value. Likewise, the Y2 signal line driver 624 may be configured to drive the voltage on the YOUT signal responsive to the Y2 control signal. For example, the Y2 signal line driver 624 may drive the YOUT signal to a high voltage via a pull up transistor responsive to the Y2 control signal having a low logical value and may drive the YOUT signal to a low voltage via a pull down transistor responsive to the Y2 control signal having a high logical value. Similar to operation of the X signal line driver 610, the combination of the Y1 signal line driver 622 and the Y2 signal line driver 624 may drive the YOUT signal to three logical voltage values, e.g., low, mid and high.

In operation, the X signal line driver 610 and the Y signal line driver 620 may drive one of three voltages to the XOUT and YOUT signals, respectively. The X signal line driver 610 may drive the XOUT signal responsive to the X1 and X2 control signals, and the Y signal line driver 620 may drive the YOUT signal responsive to the Y1 and Y2 control signals. In an example, when the X1 control signal has a low logical value, the pull up transistor of the X1 signal line driver 612 is enabled to couple the high supply voltage to the XOUT signal and pull down transistor is disabled. When the X1 control signal has a high logical value, the pull up transistor of the X1 signal line driver 612 is disabled and the pull down transistor is enabled to couple the low supply voltage to the XOUT signal. Operation of the X2 signal line driver 614, the Y1 signal line driver 622, and the Y2 signal line driver 624 responsive to the X2, Y1, and Y2 control signals, respectively, may be similar to the X1 signal line driver 612 responsive to the X1 control signal. The XOUT signal may be a combination of the voltages driven by the X1 signal line driver 612 and the X2 signal line driver 614. The YOUT signal may be a combination of the voltages driven by the Y1 signal line driver 622 and the Y2 signal line driver 624. The XOUT and YOUT signals may have a high voltage VH, a low voltage VL, or a middle voltage VMID between the high supply and low supply voltages. The middle voltage may be achieved when the X1 signal line driver 612 (or the Y1 signal line driver 622) and the X2 signal line driver 614 (or the Y2 signal line driver 624) are driving different voltages (e.g., one driving the high supply voltage and the other driving the low supply voltage).

Figure 7A:
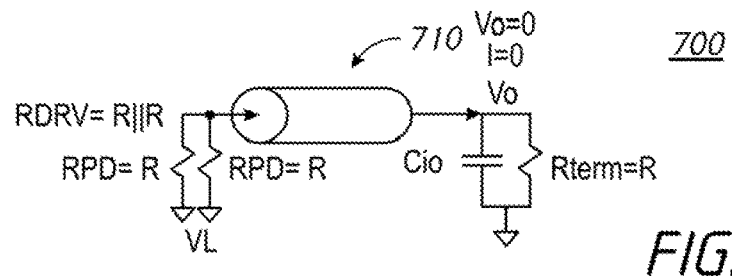
FIG. 7A-7C are schematic diagrams of an exemplary output of a driver circuit according to an embodiment of the present disclosure.
Figure 7B:
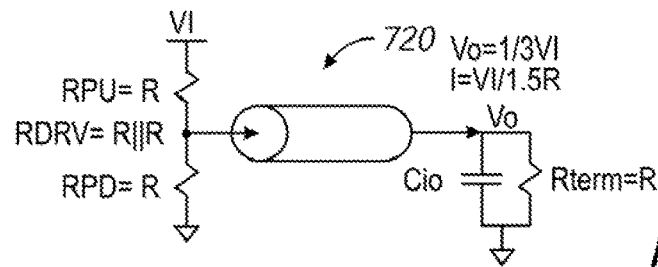
Figure 7C:
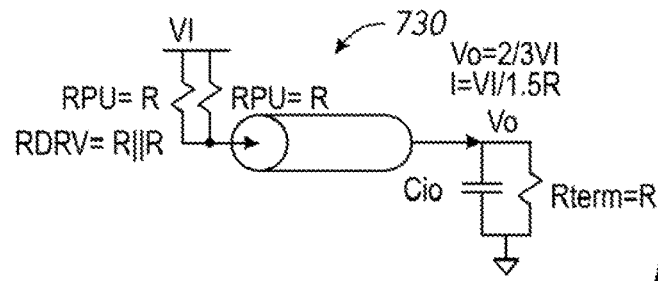

FIGS. 7A-7C depict schematic diagrams of exemplary output of a driver circuit, such as one of the X signal line driver 610 or the Y signal line driver 620 of FIG. 6, according to an embodiment of the disclosure. For example, as illustrated in FIG. 7A, the low voltage signal representation 710 may represent driving the VL voltage (e.g., when both the X1 signal line driver 612 and the X2 signal line driver 614 are driving the low supply voltage or when both the Y1 signal line driver 622 and the Y2 signal line driver 624 are driving the low supply voltage). In this case, the output voltage VO received over the signal line may be a low voltage. The RDRV may represent the inherent resistance of the pull down transistors.

As illustrated in FIG. 7B, the mid voltage signal representation 720 may represent driving the middle voltage (e.g., when one of the X1 signal line driver 612 or the X2 signal line driver 614 is driving the low supply voltage and the other is driving the high supply voltage or when one of the Y1 signal line driver 622 and the Y2 signal line driver 624 is driving the low supply voltage and the other is driving the high supply voltage). In this case, the VO voltage received over the signal line may be $1/3$ of the high supply voltage. The RDRV may represent the inherent resistance of the pull up and pull down transistor.

The high voltage signal representation 730 of FIG. 7C may represent driving the VH voltage (e.g., when both the X1 signal line driver 612 and the X2 signal line driver 614 are driving the high supply voltage or when both the Y1 signal line driver 622 and the Y2 signal line driver 624 are driving the high supply voltage). In this case, the VO voltage received over the signal line may be $2/3$ of the high supply voltage. The RDRV may represent the inherent resistance of the pull up transistors. It will be appreciated that the specific voltage levels described in the previous example are applicable when the pull-up and pull-down and termination resistances are equal. In some embodiments where the termination resistances are not equal, the overall swing will change, but the relative position of the various voltage levels will be maintained. Further, were the termination resistance coupled to a high supply voltage, then the signal levels would be different voltage values, but maintain the same relative positions. Additionally, if the termination resistance were disabled, VH would be equal to the high supply voltage and VL would be equal to the low supply voltage.

Figure 8:
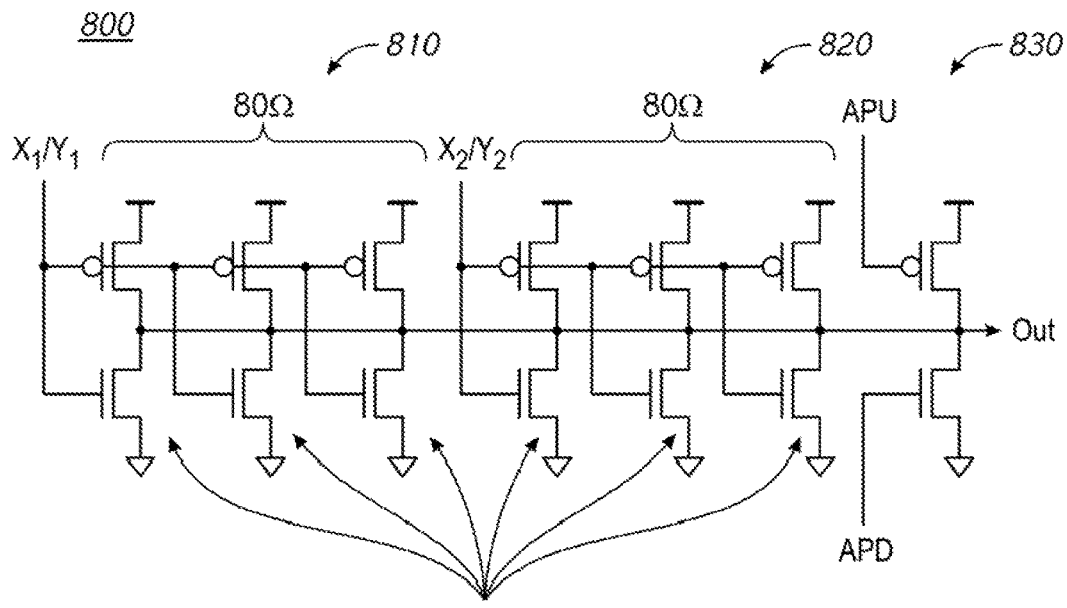
FIG. 8 is a schematic diagram of a seven leg driver circuit for a multilevel communication architecture according to an embodiment of the present disclosure.

FIG. 8 is a schematic diagram of a seven leg driver circuit 800 for multilevel communication architecture according to an embodiment of the present disclosure. The seven leg driver circuit 800 may be a driver in a DRAM, such as a double data rate (DDR) DRAM driver. The seven leg driver circuit 800 may include seven signal line drivers (e.g., "legs"). In some embodiments, each of the signal line drivers has an impedance of 240 ohms. The seven leg driver circuit 800 may include a first driver section 810 and a second driver section 820 configured to drive an output signal OUT to a signal line based on X1 and X2 control signals. The seven leg driver circuit 800 may further include an adjustment driver section 830 that is configured to adjust a voltage of the OUT signal, when, for example, the OUT signal is biased to one voltage or another due to leakage. The adjustment driver section 830 is optional, and is not included in some embodiments. In other embodiments, however, a seventh leg configured as a signal line driver may be included to provide additional signal levels for a multilevel output signal, as will be described in more detail below. The seven leg driver circuit 800 may be implemented in the encoder and driver circuit 114 and/or the encoder and driver circuit 124 of FIG. 1, the driver 240 of FIG. 2, and/or the X signal line driver 610 and/or the Y signal line driver 620 of FIG. 6.

The first driver section 810 may include three legs, each controlled responsive to the X1 control signal. Each leg may include a pull up (e.g., p-type) transistor and a pull down (e.g., n-type) transistor. Similarly, the second driver section 820 may include three legs, each controlled responsive to the X2 control signal, and each leg may include a pull up (e.g., p-type) transistor and a pull down (e.g., n-type) transistor. The adjustment driver section 830 may include a single leg with a pull up transistor controlled responsive to an adjust pull up signal APU and a pull down transistor controlled responsive to an adjust pull down signal APD. In an embodiment where each leg has an impedance of 240 ohms, the first driver section 810 has an effective impedance of 80 ohms and the second driver section 820 has an effective impedance of 80 ohms. It should be appreciated that no more than one PU and one PD are required to implement the tri-level signaling scheme. The seven leg embodiment discussed herein is discussed in the context of providing an embodiment for use with common JEDEC DDR architectures. However, driver circuits other than that shown and described with reference to FIG. 8 may be used in alternative embodiments.

In operation, the seven leg driver circuit 800 may drive the OUT signal responsive to the X1 and X2 control signals. In an example, when the X1 control signal has a low logical value, the pull up transistors of the first driver section 810 are enabled to couple the high supply voltage to the XOUT signal and pull down transistors are disabled. When the X1 control signal has a high logical value, the pull up transistors of the first driver section 810 are disabled and the pull down transistors are enabled to couple the low supply voltage to the OUT signal. Operation of the second driver section 820 responsive to the X2 control signal, respectively, may operate similar to the first driver section 810 responsive to the X1 control signal. The OUT signal may be a combination of the voltages driven by the first driver section 810 and the second driver section 820. The OUT signal may have a VI voltage, a VL voltage, or a middle voltage between the high supply and low supply voltages. The middle voltage may be achieved when the first driver section 810 and the second driver section 820 are driving different voltages (e.g., one driving the high supply voltage and the other driving the low supply voltage).

The adjustment driver section 830 may compensate for drive strength differences between the first driver section 810 and the second driver section 820. For example, the adjustment driver section 830 may pull the voltage of the OUT signal slightly up or down if the combination of the first driver section 810 and the second driver section 820 are not able to drive the OUT signal to a proper voltage. The APU signal may pull the OUT signal slightly up when having an active low value and the APD signal may pull the OUT signal slightly down when having an active high value.

Figure 9:
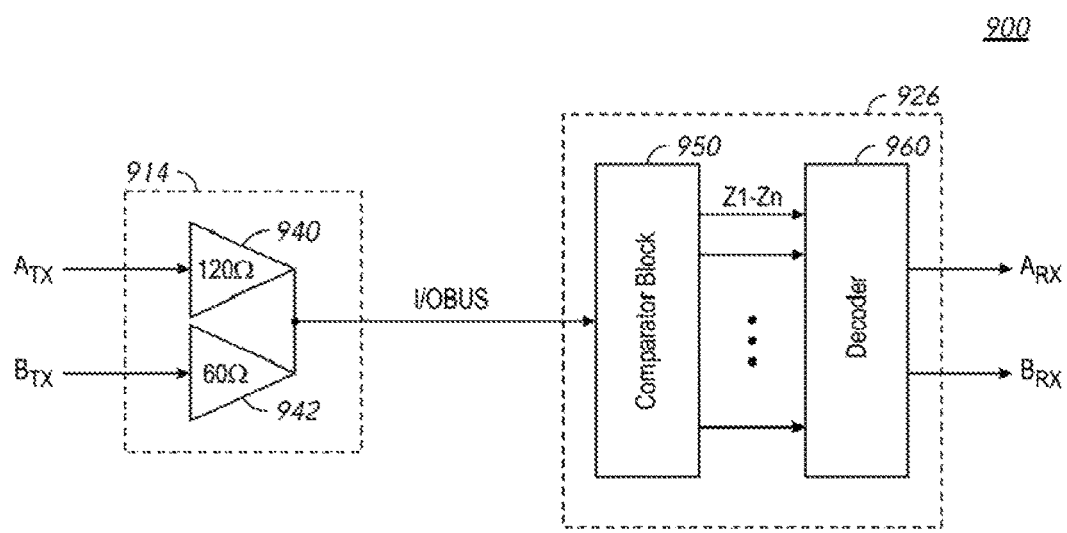
FIG. 9 is a block diagram of an apparatus for a multilevel communication architecture according to an embodiment of the present disclosure.

FIG. 9 is a block diagram of an apparatus 900 for a multilevel communication architecture according to an embodiment of the present disclosure. The apparatus 900 may include a signal driver 914 coupled to a receiver 926 via an I/O bus. The signal driver 914 may be implemented in the driver circuit 114 and/or the driver circuit 124 of FIG. 1 and the receiver 926 may be implemented in the receiver and decoder circuit 116 and/or the receiver and decoder circuit 126 of FIG. 1.

The signal driver 914 may include a driver circuit 940 and a driver circuit 942. In some embodiments, the driver circuit 940 has an impedance that is twice an impedance of the driver circuit 942. For example, in an embodiment the driver circuit 940 has an impedance of 120 ohms and the driver 942 has an impedance of 60 ohms. The driver circuit 940 may receive bitstream ATX and drive an output signal in response, and the driver circuit 942 may receive bitstream BTX and drive an output signal in response. The output signal driven by the driver circuit 940 is combined with the output signal driven by the driver circuit 942 to provide a signal to the I/O bus based on the ATX and BTX bitstreams. For example, the signal may be a multilevel signal representing data of the ATX and BTX bitstreams. In some embodiments, the driver circuits 940 and 942 may each be a signal line driver having a pull-up (e.g., p-type) transistor coupled in series with a pull down (e.g., n-type) transistor. A source of the pull-up transistor is coupled to a high supply voltage and the source of the pull-down transistor is coupled to a low supply voltage. Gates of the pull-up and pull-down transistors of the driver circuit 940 are provided with the ATX bitstream and gates of the pull-up and pull-down transistors of the driver circuit 942 are provided with the BTX bitstream. In other embodiments, the driver circuits 940 and 942 may be implemented using other configurations. In contrast to the signal driver 214 of FIG. 2, the signal driver 914 does not include an encoder. The ATX and BTX signals are provided to the driver circuits 940 and 942 without encoding to provide a signal to the I/O bus.

The receiver 926 may include comparator block 950 coupled to a decoder 960. The comparator 950 may be configured to receive the signal from the I/O bus and provide Z1-Zn signals (n is a whole number) to the decoder 960. The comparator block 950 may include circuits (not shown in FIG. 9) configured to compare the signal from the I/O bus against reference signals to provide the Z1-Zn signals. For example, the comparator block 950 may include comparators that compare the signal from the I/O bus against various reference signals to provide the Z1-Zn signals. The decoder 260 may include logic to generate the bitstreams ARX and BRX based on the Z1-Zn signals from the comparator block 950. The ARX and BRX signals may be logical equivalents of data transmitted by the ATX and BTX signals.

In operation, the ATX and BTX signals may be bitstreams to be transmitted over the I/O bus. Rather than send each bitstream on a separate signal line, the signal driver 914 may provide a signal based on the ATX and BTX signals to be transmitted over a signal line using a multilevel signal. For example, the signal driver 914 may receive the ATX and BTX signals, and during each symbol period, the driver circuits 940 and 942 may drive the signal line of the I/O bus with a voltage that will be used by the receiver 926 to provide the ARX and BRX signals. The relative impedances of the driver circuits 940 and 942 result in a combined signal that may be used to represent data of the ATX and BTX bitstreams using fewer signal lines than one signal line per bitstream. For example, as in the embodiment of FIG. 9, data of the ATX and BTX bitstreams are provided to the receiver 926 on fewer than two signal lines (e.g., one signal on the I/O bus rather than one signal line for the ATX bitstream and another signal line for the BTX bitstream). Although FIG. 9 illustrates operation with bitstreams ATX and BTX for providing bitstreams ARX and BRX, the number of bit streams may be different in other embodiments of the invention. For example, in some embodiments, a bitstream CTX may also be provided to the signal driver 914 in addition to the ATX and BTX bitstreams, a multilevel signal may be provided over the I/O bus representing the data from the ATX, BTX, and CTX bitstreams. Such embodiments are within the scope of the present invention.

Figure 10:
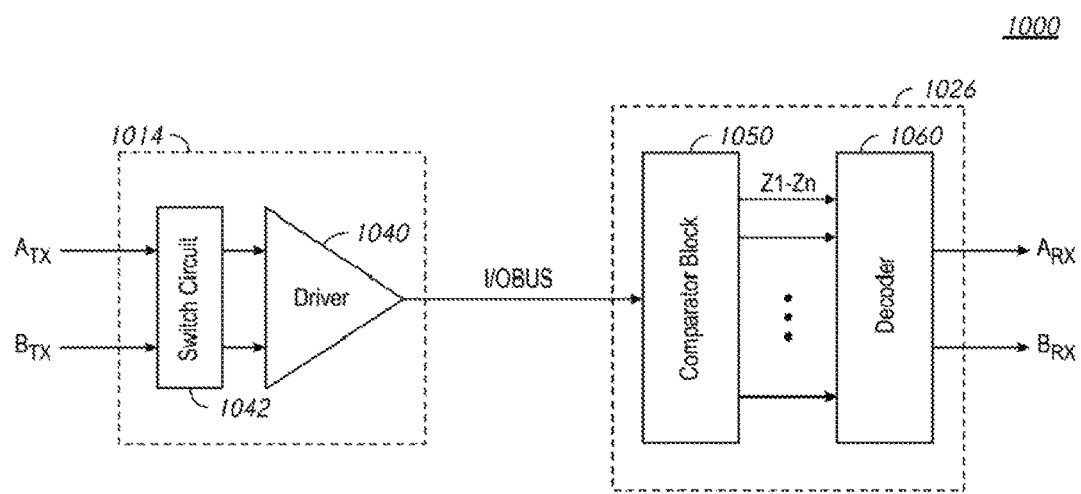
FIG. 10 is a block diagram of an apparatus for a multilevel communication architecture according to an embodiment of the present disclosure.

FIG. 10 is a block diagram of an apparatus 1000 for a multilevel communication architecture according to an embodiment of the present disclosure. The apparatus 1000 may include a signal driver 1014 coupled to a receiver 1026 via an I/O bus. The signal driver 1014 may be implemented in the driver circuit 114 and/or the driver circuit 124 of FIG. 1 and the receiver 1026 may be implemented in the receiver and decoder circuit 116 and/or the receiver and decoder circuit 126 of FIG. 1.

The signal driver 1014 may include a driver circuit 1040 and a switch circuit 1042. The switch circuit 1042 may receive bitstream ATX and bitstream BTX and provide the ATX and BTX bitstreams to the driver circuit 1040. The switch circuit 1042 is provided a control signal SWCTL that controls the routing of the ATX and BTX signals to circuits of the driver circuit 1040. In some embodiments, the SWCTL signal may be provided by a command decoder. In other embodiments, the SWCTL signal may be provided by programmable elements that are programmed to set the routing of the ATX and BTX signals to the driver circuit 1040. The switch circuit may include multiplexer circuits in some embodiments that are configured to provide the ATX and BTX bitstreams to the driver circuit 1040. In response to the ATX and BTX bitstreams, the driver circuit 1040 may drive an output signal to the I/O bus that is based on the ATX and BTX bitstreams. For example, the signal may be a multilevel signal representing data of the ATX and BTX bitstreams. In some embodiments, the driver circuit 1040 may include a plurality of signal line drivers. In contrast to the signal driver 214 of FIG. 2, the signal driver 1014 does not include an encoder. The ATX and BTX signals are provided to the driver circuit 1040 (through the switch circuit 1042) without encoding to provide a signal to the I/O bus.

The receiver 1026 may include comparator block 1050 coupled to a decoder 1060. The comparator 1050 may be configured to receive the signal from the I/O bus and provide Z1-Zn signals to the decoder 1060. The comparator block 1050 may include circuits (not shown in FIG. 10) configured to compare the signal from the I/O bus against reference signals to provide the Z1-Zn signals. For example, the comparator block 1050 may include comparators that compare the signal from the I/O bus against various reference signals to provide the Z1-Zn signals. The decoder 1060 may include logic to generate the bitstreams ARX and BRX based on the Z1-Zn signals from the comparator block 1050. The ARX and BRX signals may be logical equivalents of data transmitted by the ATX and BTX signals.

In operation, the ATX and BTX signals may be bitstreams to be transmitted over the I/O bus. Rather than send each bitstream on a separate signal line, the signal driver 1014 may provide a signal based on the ATX and BTX signals to be transmitted over a signal line using a multilevel signal. For example, the signal driver 1014 may receive the ATX and BTX signals, and during each symbol period, the driver circuit 1040 may drive the signal line of the I/O bus with a voltage that will be used by the receiver 1026 to provide the ARX and BRX signals. As will be described in more detail below, the signal provided by the signal driver 1014 may be used to represent data of the ATX and BTX bitstreams using fewer signal lines than one signal line per bitstream. For example, as in the embodiment of FIG. 10, data of the ATX and BTX bitstreams are provided to the receiver 1026 on fewer than two signal lines (e.g., one signal on the I/O bus rather than one signal line for the ATX bitstream and another signal line for the BTX bitstream). Although FIG. 10 illustrates operation with bitstreams ATX and BTX and for providing bitstreams ARX and BRX, the number of bit streams may be different in other embodiments of the invention. For example, in some embodiments, a bitstream CTX may also be provided to the signal driver 1014 in addition to the ATX and BTX bitstreams, a multilevel signal may be provided over the I/O bus representing the data of the ATX, BTX, and CTX bitstreams. Such embodiments are within the scope of the present invention.

Figure 11:
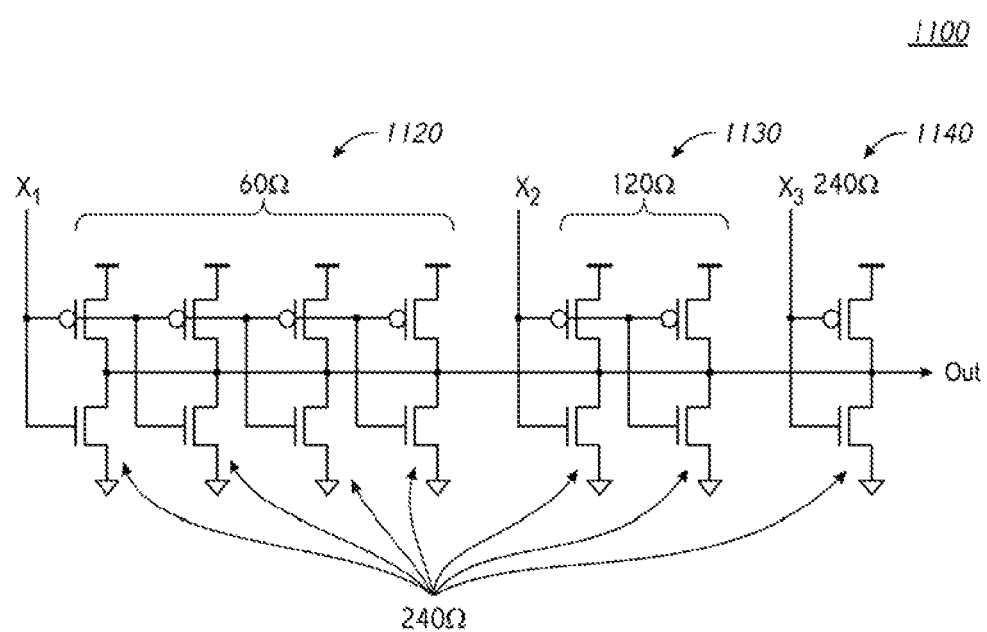
FIG. 11 is a schematic diagram of a seven leg driver circuit for a multilevel communication architecture according to an embodiment of the present disclosure.

FIG. 11 is a schematic drawing of a seven leg driver circuit 1100 for a multilevel signal architecture implementing pulse-amplitude modulation (PAM) according to an embodiment of the disclosure. The seven leg driver circuit 1100 may be a driver in a DRAM, such as a double data rate (DDR) DRAM driver. The seven leg driver circuit 1100 may include seven signal line drivers (e.g., "legs"). In some embodiments, each of the signal line drivers has an impedance of 240 ohms. The seven leg driver circuit 1100 may include a first driver section 1120, a second driver section 1130, and a third driver section 1140 configured to drive an output signal OUT to a signal line based on ATX and BTX signals, which may be provided to the legs of the driver circuit 1100 by a switch circuit, for example, the switch circuit 1042 (FIG. 10). The output signal OUT may be a multilevel signal representing data of the ATX and BTX bitstreams that drives the I/O bus. The seven leg driver circuit 1100 may be implemented in the driver circuit 1040 of FIG. 10.

The first driver section 1120 may include four legs, each controlled responsive to the X1 control signal. Each leg may include a pull up (e.g., p-type) transistor and a pull down (e.g., n-type) transistor. Similarly, the second driver section 1130 may include two legs, each controlled responsive to the X2 control signal, and each leg may include a pull up (e.g., p-type) transistor and a pull down (e.g., n-type) transistor. Lastly, the third driver section 1140 may include one leg, which is controlled responsive to the X3 control signal, and each leg may include a pull up (e.g., p-type) transistor and a pull down (e.g., n-type) transistor. In an embodiment when each leg has an impedance of 240 ohms, the first driver section 1120 has an effective impedance of 60 ohms, the second driver section 1130 has an effective impedance of 120 ohms, and the third driver section 1140 has an effective impedance of 240 ohms.

In operation, the seven leg driver circuit 1100 may drive the OUT signal responsive to the ATX and BTX bitstreams. The ATX and BTX bitstreams are provided to the legs of the driver sections 1120, 1130, and/or 1140 to provide an output signal OUT having appropriate voltage for the multilevel signal, for example, using PAM to convert a plurality of bitstreams into a multilevel signal. The bitstreams may be provided to appropriate legs of the driver circuit 1100, for example, by a switch circuit that may be controlled or programmed as previously described. The switch circuit may be controlled to effect a PAM conversion by providing the bitstreams to the appropriate legs of the driver circuit 1100.

For example, in some embodiments using PAM4 to convert two bitstreams (e.g., the ATX and BTX bitstreams) into an output signal, the ATX signal may be provided to the legs of the first driver section 1120 as the X1 control signal and the BTX signals may be provided to the legs of the second driver section 1130 as the X2 control signal. The resulting output signal will have a voltage representing the data of the ATX and BTX bitstreams. The third driver section 1140 is not needed for the example PAM4 configuration, and may be omitted or ignored.

In another example, in some embodiments using PAM2 to convert a bitstream (e.g., the ATX bitstream or the BTX bitstream) into an output signal, the bitstream may be provided to different combinations of the legs of the seven leg driver circuit 1100 independent of the first, second, and third driver sections. For example, the bitstream may be provided to one leg, which results in a drive based on 240 ohms resistance. The bitstream may be provided to two legs, which results in a drive based on 120 ohms resistance. In another example the bitstream may be provided to three legs, which results in a drive based on 80 ohms resistance. The bitstream may be provided to any combination of the seven legs of the driver circuit 1100 to provide a drive based on a resulting resistance, with the resistance decreasing with each additional leg. In an example where the bitstream is provided to all seven legs of the driver circuit 1100, the drive is based on 34 ohm resistance. Thus, the number of legs to which the bitstream is provided may provide a desired drive based on the resulting resistance.

In another example, in some embodiments the seven leg driver circuit 1100 may be used to provide PAM8 conversion of three bitstreams (e.g., the ATX bitstream, the BTX bitstream, and a CTX bitstream). For example, in some embodiments using PAM8 to convert three bitstreams into an output signal, the ATX signal may be provided to the legs of the first driver section 1120 as the X1 control signal, the BTX signals may be provided to the legs of the second driver section 1130 as the X2 control signal, and the CTX signals may be provided to the legs of the third driver section 1140 as the X3 control signal. The resulting output signal will have a voltage representing the data of the ATX, BTX, and CTX bitstreams. The order of the bitstream to driver section connection is not important, so long as the receiver is aware for the decoding process.

Figure 12:
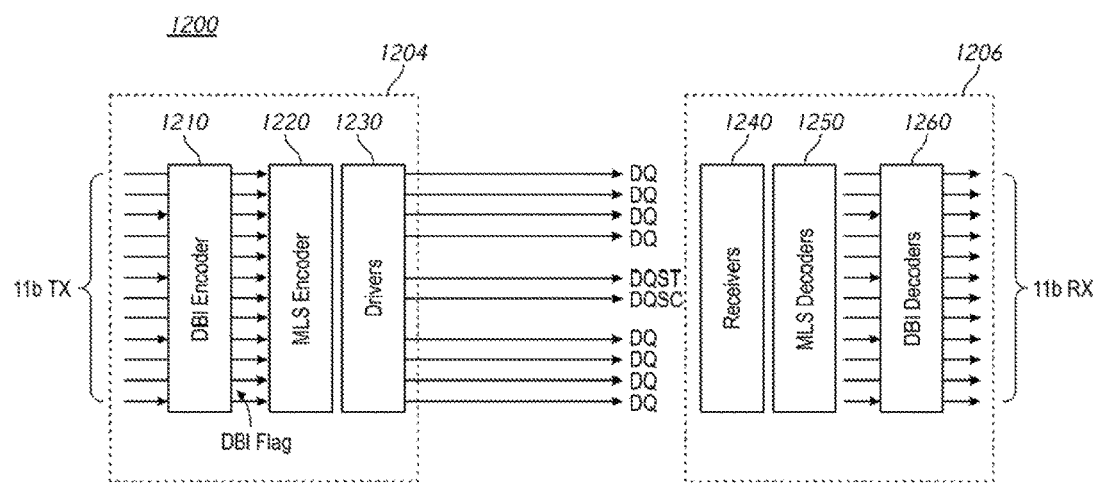
FIG. 12 is a block diagram of a multilevel communication architecture with data bus inversion system according to an embodiment of the present disclosure.

FIG. 12 is a block diagram of system that includes a multilevel communication architecture with data bus inversion (DBI) system 1200 according to an embodiment of the present disclosure. The system 1200 may include a multilevel signal driver 1204 configured to transmit to a multilevel signal receiver 1206 via an I/O bus. The multilevel signal driver 1204 may be implemented in the encoder and driver circuit 114 and/or the encoder and driver circuit 124 of FIG. 1 and the multilevel signal receiver 1206 may be implemented in the receiver and decoder circuit 116 and/or the receiver and decoder circuit 126 of FIG. 1.

The multilevel signal driver 1204 may include a DBI encoder 1210, multilevel signal encoder 1220, and drivers 1230 coupled in series. The DBI encoder 1210 may be configured to perform a DBI operation on 11 data bits to be transmitted to the multilevel signal receiver 1206. The DBI operation may reduce current consumption during transmission. Typically, in a DBI operation, if more than half of the data bits in a block of data to be sent have the first logical value, the DBI data may be encoded by logically inverting each data bit of the block of data. For example, the data bits in the block of data having the first logic value are inverted to have the second logical value (to be represented by a relatively low voltage), and the data bits in the block of data having the second logical value are inverted to have the first logical value (to be represented by a relatively high voltage). As a result, more than half of the data bits of the DBI data will have the second logical value, represented by the relatively low voltage. If half or less than half of the data bits in the block of data from have the second logical value, the DBI data may be encoded by providing the block of data in its original state. However, in the case of multilevel signaling, the DBI operation may be dependent on the encoding scheme to generate the transmitted signals. As can be seen in encoding scheme employed in tables 510 and 520 of FIG. 5, the only scenarios in which both the X and Y signal lines transmit a relatively mid or high voltage (e.g., and thus higher electrical current) is when the C bitstream has a logical 1 value. Thus, the DB encoder 1210 in a multilevel signal driver 1204 that employs the same encoding scheme depicted in FIG. 5 may invert the C bitstreams for each set of three bits if half or more than half of the C bitstreams have a logical 1 value. In the example depicted in FIG. 12, this may mean that if two or more of the four C bitstreams have a logical one value, the C bitstream values may be inverted. The multilevel signal driver 1204 may also set a DBI flag to indicate whether the C bitstreams have been inverted.

The multilevel signal encoder 1220 may be configured to receive the DBI data and the DBI flag and may break the DBI data in to sets of three bitstreams. The multilevel signal encoder 1220 may encode each set of three bitstreams into a two multi-level signals using control signals provided to the multilevel signal driver 1230. The drivers 1230 may receive the control signals for each pair of signal lines and may drive a voltage on each signal line of the I/O bus based on the respective control signals. Thus, the multilevel signal encoder 1220 and the drivers 1230 may convert each set of three bitstreams into two multilevel signals to be driven over the I/O bus.

The multilevel signal receiver 1206 may include receivers and latches 1240, multilevel signal decoders 1250, and DBI decoders 1260. The receivers and latches 1240 may include comparators that are configured to determine a signal level of each signal line. The multilevel signal decoders 1250 may include logic to recover each set of three bitstreams of DBI data based on the outputs of the comparators from the receivers and latches 1240. Each of the recovered sets of three bitstreams of DBI data and DBI flag may be logical equivalents of corresponding sets of three bitstreams encoded by the multilevel signal encoder 1220. The DBI decoders 1260 may decode each of the recovered sets of three bitstreams of DBI data based on the DBI flag to recover the original eleven bitstreams of data.

In operation, the multilevel signal driver 1204 may be configured to transmit 11 bitstreams of data along with a DBI flag bit over eight signal lines using multi-level signal encoding, and the multilevel signal receiver 1206 may be configured to receive the multi-level signals over the eight signal lines and recover the 11 bitstreams by decoding received signal levels and decoding DBI data based on the DBI flag. While the multilevel signal driver 1204 is described as encoding each set of three bitstreams over a two signal lines using multilevel signals, other encoding schemes may be implemented, such as transmitting two bitstreams over one signal line. Thus, the multilevel signal driver 1204 may receive the 11 bitstreams, and during each symbol period, may encode a symbol for each set of three bitstreams to be driven on a pair of the eight signal lines using control signals to control the multilevel signal driver 1230.

As previously described, the DBI encoder 1210 may perform a DBI operation on 11 bitstreams to generate DBI data and a DBI flag. In the example depicted in FIG. 12 based on the encoding scheme depicted in FIG. 5, the DBI operation may include dividing the 11 bitstreams into sets of three (e.g., with one of the sets of three including the DBI flag), and determining a count of the third bitstreams of each set that has a logical 1 value. If the count is greater than or equal to two, the DBI encoder 1210 may invert each of the third bitstreams to generate DBI data and set the DBI flag. If the count is less than 2, the DBI encoder 1210 may leave each of the third bitstreams in their original state as the DBI data and may clear the DBI flag. The DBI data and the DBI flag may be provided to the multilevel signal encoder 1220.

The multilevel signal encoder 1220 may encode each set of three bitstreams of the DBI data and DBI flag for transmission over a pair multi-level signal lines. The multilevel signal encoder 1220 may include logic that generates respective control signals for each pair of signal lines based on the three bitstreams. The logic of the multilevel signal encoder 1220 may include logic similar to the logic depicted in FIGS. 3A to 3D for each set of three bitstreams. The drivers 1230 may include drivers that are configured to drive a multi-level signal on each of pair of the eight signal lines based on the respective control signals provided by the multilevel signal encoder 1220. The drivers 1230 may implement the seven leg driver circuit 800 of FIG. 8 for one or more signal lines.

The voltages driven on each of the 8 signal lines may be captured by the multilevel signal receiver 1206. The receivers and latches 1240 of the multilevel signal receiver 1206 may include latches that are configured to capture symbols of each pair of the 8 signal lines responsive to clock and command signals DQST and DQSC. The multilevel signal decoders 1250 may be configured to receive the captured voltages from the receivers and latches 1240. The multilevel signal decoders 1250 may include comparators and decoding logic to receive and recover the DBI data and the DBI flag by decoding each pair of signal lines to recover a respective set of three bitstreams. The comparators may be configured to provide respective output signals based on a comparison of a voltage of a respective signal line with a reference voltage. The output signals associated with each pair of signal lines may be provided to the decoding logic of the multilevel signal decoders 1250. The decoding logic of the multilevel signal decoders 1250 may decode output signals for each pair of signal lines to recover each set of three bitstreams of the DBI data and DBI flag. In an embodiment, the decoding logic may include the logic depicted in FIGS. 4A-4C.

The recovered DBI data and DBI tag may be provided to the DBI decoders 1260. The DBI decoders 1260 may decode the DBI data based on the DBI flag to recover the logical equivalents of the 11 bitstreams that were provided to the DBI encoder 1210.

The encoding scheme employed in the DBI encoder 1210 and the multilevel signal encoder 1220 and the decoding scheme described in the multilevel signal decoders 1250 and multilevel signal decoders 1250 may be based on the multilevel architecture (e.g., the number of independent levels available for each signal over the I/O bus) and the encoding and decoding implementation (e.g., the mapping of combined bitstreams to the multilevel signal values). One of skill in the art would recognize that other multilevel architectures (e.g., PAM or 4 level signaling) and other encoding and decoding implementations may be implemented in the system 1200. Thus, while the system 1200 includes converting three bitstreams into two multilevel signals, other implementations may be realized by one of skill in the art.

Figure 13A:
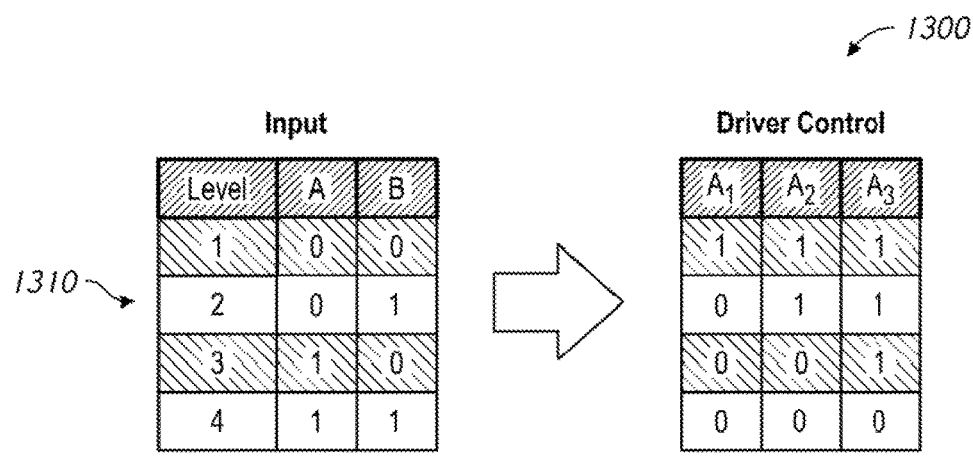
FIGS. 13A and 13B are an encoding map and a schematic of a seven leg driver circuit for a multilevel communication signal architecture implementing pulse amplitude modulation according to an embodiment of the disclosure.
Figure 13B:
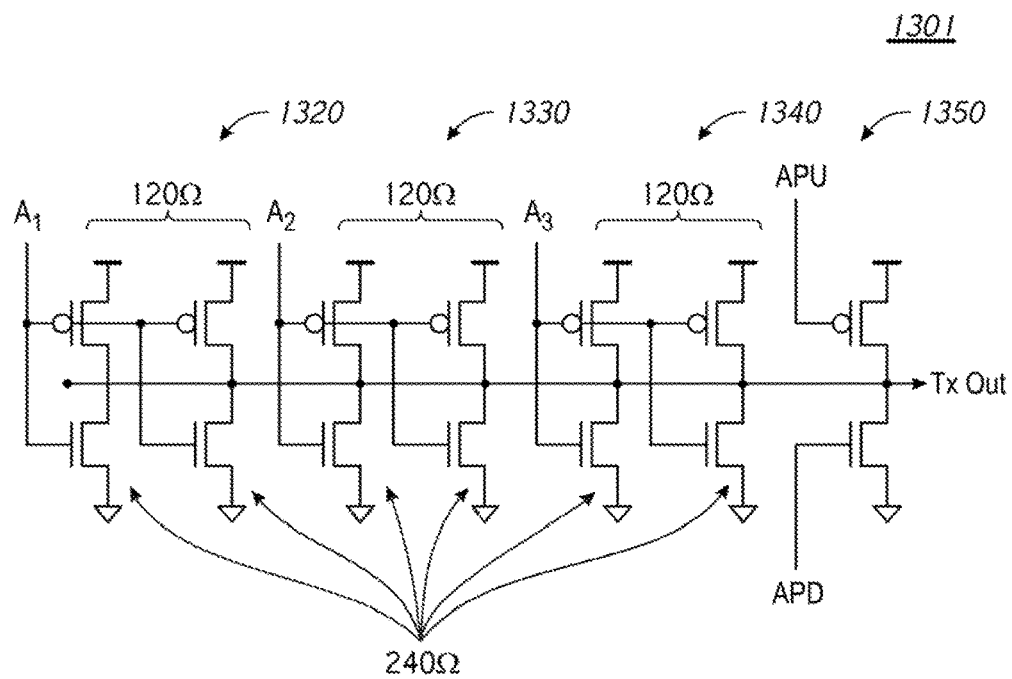
Figure 14A:
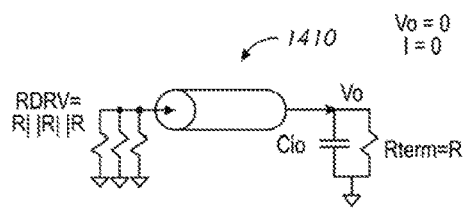
FIGS. 14A-14D are schematic diagrams of exemplary outputs of the seven leg driver circuit of FIG. 13B according to an embodiment of the disclosure.
Figure 14B:
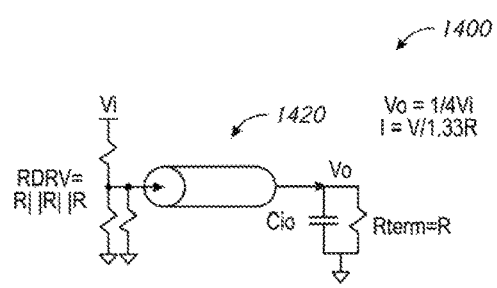
Figure 14C:
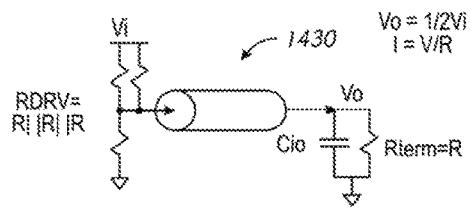
Figure 14D:
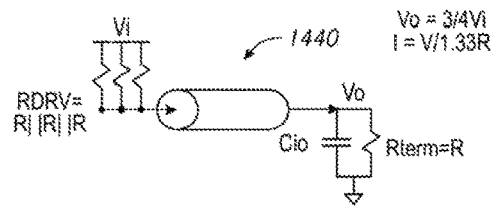

FIGS. 13A and 13B depict an encoding map 1300 and a schematic of a multi-leg driver circuit 1301 for a multilevel signal architecture implementing PAM according to an embodiment of the disclosure. The multi-leg driver circuit 1301 includes seven legs, and may be referred herein as a seven leg driver circuit. The table 1310 maps bitstream values to control signals A1, A2, and A3. The control signals A1, A2, and A3 may be used by the drivers 1230 of FIG. 12 and/or the driver 1301 to drive a voltage on a signal line. The encoding map 1200 may be used by the output encoder and driver circuit 114 and/or 124 of FIG. 1 and/or the multilevel signal encoder 1220 of FIG. 12. The table 1310 includes possible logical combinations of A and B bitstreams and exemplary unique multilevel encoding of A1, A2, and A3 control signals that are used by the driver 1301 to drive a signal line to one of four signal values. For example, when the A and B bitstreams each have a logical value of zero (e.g., line 1 of the table 1310), the A1, A2, and A3 signals may be driven to a logical values of one. In another example, if the A bitstream has a logical value of zero and the B bitstream has a logical value of one, the A1 signal may be logical value of zero and the A2 and A3 signals may be driven to logical values of one. It will be appreciated that different mapping may be employed to encode the A and B, so long as each unique logical combination of the A and B signals maps to a unique combination on the A1, A2, and A3 control signals.

The seven leg driver circuit 1301 may be a driver in a DRAM, such as a double data rate (DDR) DRAM driver. The seven leg driver circuit 1301 may include seven signal line drivers (e.g., "legs"). In some embodiments, each of the signal line drivers have an impedance of 240 ohms. The seven leg driver circuit 1301 may include a first driver section 1320, a second driver section 1330, and a third driver section 1340 configured to drive an output signal OUT to a signal line based on A1, A2, and A3 control signals. The seven leg driver circuit 1301 may further include an adjustment driver section 1350 that is configured to adjust a voltage of the OUT signal, when, for example, the OUT signal is biased to one voltage or another due to leakage. The seven leg driver circuit 1301 may be implemented in the 114 and/or the 124 of FIG. 1 and/or the drivers 1230 of FIG. 12.

The first driver section 1320 may include two legs, each controlled responsive to the A1 control signal. Each leg may include a pull up (e.g., p-type) transistor and a pull down (e.g., n-type) transistor. Similarly, the second driver section 1330 may include two legs, each controlled responsive to the A2 control signal, and each leg may include a pull up (e.g., p-type) transistor and a pull down (e.g., n-type) transistor. Lastly, the third driver section 1340 may include two legs, each controlled responsive to the A3 control signal, and each leg may include a pull up (e.g., p-type) transistor and a pull down (e.g., n-type) transistor. The adjustment driver section 1350 may include a single leg with a pull up transistor controlled responsive to an adjust pull up signal APU and a pull down transistor controlled responsive to an adjust pull down signal APD. In an embodiment having each leg having an impedance of 240 ohms, the first driver section 1320 has an effective impedance of 120 ohms, the second driver section 1330 has an effective impedance of 120 ohms, and the third driver section 1340 has an effective impedance of 120 ohms.

In operation, 1301 may drive the OUT signal responsive to the A1, A2, and A3 control signals. In an example, when the A1 control signal has a low logical value, the pull up transistors of the first driver section 1320 are enabled to couple the high supply voltage to the XOUT signal and pull down transistors are disabled. When the A1 control signal has a high logical value, the pull up transistors of the first driver section 1320 are disabled and the pull down transistors are enabled to couple the low supply voltage to the OUT signal. Operation of the second driver section 1330 responsive to the A2 control signal and operation of the third driver section 1340 responsive to the A3 control signal may be similar to operation of the third driver section 1340 responsive to the A1 control signal. The OUT signal may be a combination of the voltages driven by the first driver section 1320, the second driver section 1330, and the third driver section 1340. The OUT signal may have a VH voltage, a VL voltage, or a high-middle voltage between the high supply and the low supply voltages and a low-middle voltage between the high middle voltage and the low supply voltage. The high-middle voltage may be achieved when the two of the first driver section 1320, the second driver section 1330, and the third driver section 1340 are driving the high supply voltage and the other is driving the low supply voltage. The low-middle voltage may be achieved when the two of the first driver section 1320, the second driver section 1330, and the third driver section 1340 are driving the low supply voltage and the other is driving the high supply voltage.

The adjustment driver section 1350 may compensate for drive strength differences between the first driver section 1320, the second driver section 1330, and the third driver section 1340. For example, the adjustment driver section 1350 may pull the voltage of the OUT signal slightly up or down if the combination of the first driver section 1320, the second driver section 1330, and the third driver section 1340 are not able to drive the OUT signal to a proper voltage. The APU signal may pull the OUT signal slightly up when having an active low value and the APD signal may pull the OUT signal slightly down when having an active high value.

FIGS. 14A-14D depict a schematic diagram of exemplary output of the multi-leg driver circuit 1301 of FIG. 13B according to an embodiment of the disclosure. For example, the low voltage signal representation 1410 may represent driving the VL voltage (e.g., when the first driver section 1320, the second driver section 1330, and the third driver section 1340 are driving the low supply voltage). In this case, the output voltage VO received over the signal line may be a low voltage. The RDRV may represent the inherent resistance of the pull down transistors.

The low-mid voltage signal representation 1420 may represent driving the lower-middle voltage (e.g., when one of the first driver section 1320, the second driver section 1330, and the third driver section 1340 is driving the high supply voltage and the others are driving the low supply voltage). In this case, the VO voltage received over the signal line may be ¼ of the high supply voltage. The RDRV may represent the inherent resistances of the pull up transistor and pull down transistors.

The high-mid voltage signal representation 1430 may represent driving the upper-middle voltage (e.g., when one of the first driver section 1320, the second driver section 1330, and the third driver section 1340 is driving the low supply voltage and the others are driving the high supply voltage). In this case, the VO voltage received over the signal line may be ½ of the high supply voltage. The RDRV may represent the inherent resistances of the pull up transistor and pull down transistors.

The high voltage signal representation 1440 may represent driving the VH voltage (e.g., when all of the first driver section 1320, the second driver section 1330, and the third driver section 1340 are driving the high supply voltage). In this case, the VO voltage received over the signal line may be ¾ of the high supply voltage.

Figure 15:
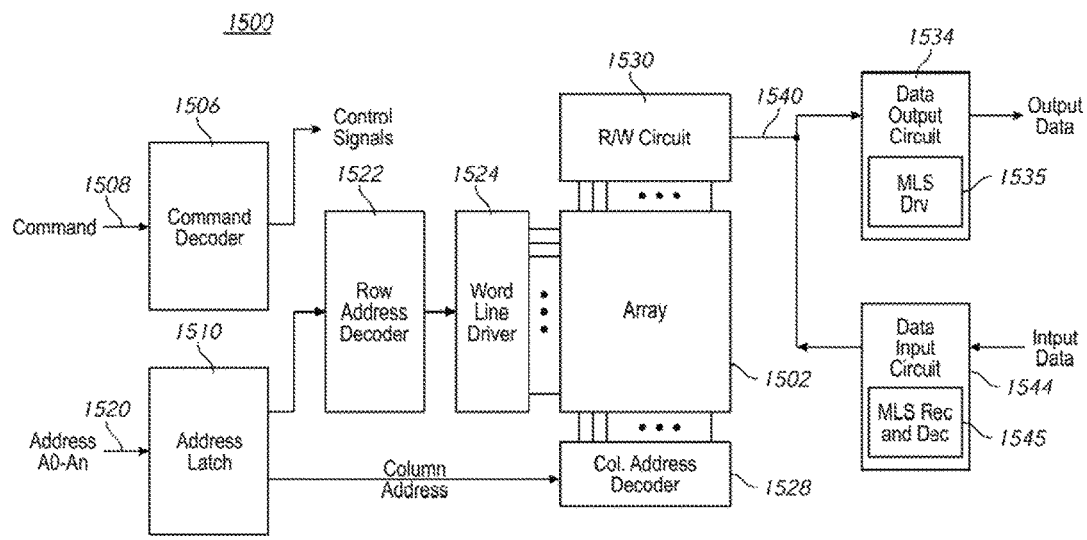
FIG. 15 is a block diagram of a portion of a memory according to an embodiment of the present disclosure.

FIG. 15 illustrates a portion of a memory 1500 according to an embodiment of the present disclosure. The memory 1500 includes an array 1502 of memory cells, which may be, for example, volatile memory cells, non-volatile memory cells, DRAM memory cells, SRAM memory cells, flash memory cells, or some other types of memory cells. The memory 1500 includes a command decoder 1506 that receives memory commands and addresses through an ADDR/CMD bus. The command decoder 1506 provides control signals, based on the commands received through the ADDR/CMD bus. The command decoder 1506 also provides row and column addresses to the memory 1500 through an address bus and an address latch 1510. The address latch then outputs separate column addresses and separate row addresses.

The row and column addresses are provided by the address latch 1510 to a row address decoder 1522 and a column address decoder 1528, respectively. The column address decoder 1528 selects bit lines extending through the array 1502 corresponding to respective column addresses. The row address decoder 1522 is connected to word line driver 1524 that activates respective rows of memory cells in the array 1502 corresponding to received row addresses. The selected data line (e.g., a bit line or bit lines) corresponding to a received column address are coupled to a read/write circuitry 1530 to provide read data to a data output circuit 1534 via an input-output data bus 1540. The data output circuit 1534 may include multi-level signal encoders and drivers 1535 that are configured to encode and drive multilevel voltages on signal lines on the output data bus. The multi-level signal encoders and drivers 1535 may include the output encoder and driver circuit 114 and/or the output encoder and driver circuit 124 of FIG. 1, the signal driver 214 of FIG. 2, the logic circuits 300 of FIGS. 3A-3D, the X signal line driver 610 and the Y signal line driver 620 of FIG. 6, the seven leg driver circuit 800 of FIG. 8, the multilevel signal driver 1204 of FIG. 12, the seven leg driver circuit 1301 of FIG. 13B, or combinations thereof. The multi-level signal encoders and drivers 1535 may be configured to encode signals based on the encoding implementation 500 described in FIG. 5 and/or the encoding implementation 1300 depicted in FIG. 13A. Write data are provided to the array 1502 through a data input circuit 1544 and the memory array read/write circuitry 1530. The data input circuit 1544 may include multi-level signal receivers and decoders 1545 that are configured to receive and decode multilevel voltages on signal lines on the input data bus. The multi-level signal receivers and decoders 1545 may include the receiver and decoder circuit 116 and/or the receiver and decoder circuit 126 of FIG. 1, the 216 of FIG. 2, the logic circuits 400 of FIGS. 4A-4C, the multilevel signal receiver 1206 of FIG. 12, or combinations thereof. The multi-level signal encoders and drivers 1535 may be configured to decode signals based on the encoding implementation 500 described in FIG. 5 and/or the encoding implementation 1300 depicted in FIG. 13A. The command decoder 1506 responds to memory commands and addresses provided to the ADDR/CMD bus to perform various operations on the array 1502. In particular, the command decoder 1506 is used to provide control signals to read data from and write data to the array 1502.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
a driver circuit configured to convert a plurality of bitstreams into a plurality of multilevel signals, wherein a count of the plurality of bitstreams is greater than a count of the plurality of multilevel signals, the driver circuit further configured to drive the plurality of multilevel signals onto a plurality of signal lines using individual drivers, wherein each of the individual drivers is configured to drive more than two voltages,
wherein the driver circuit includes a multilevel signal encoder including a plurality of logic circuits, and each logic circuit of the plurality of logic circuits included in the multilevel signal encoder is configured to input all of the plurality of bitstreams,
wherein the driver circuit is a multi-leg driver that is divided into at least two sections for driving the more than two voltages,
wherein each of the at least two sections of the driver circuit associated with one of the plurality of multilevel signals is configured to be controlled to drive the plurality of multilevel signals onto respective signal lines, and
wherein first and second control signals are used to control respective sections of the plurality of sections of the driver circuit associated with one of the plurality of multilevel signals, and each of the first and second control signals is generated based on all of the plurality of bitstreams.

2. The apparatus of claim 1, wherein the multilevel signal encoder is further configured to, during a symbol period, map a combination of values of the plurality of bitstreams to a combination of voltages on the plurality of multilevel signals and to set the first and second control signals associated with one of the plurality of multilevel signals, for driving the combination of voltages on the plurality of multilevel signals.

3. The apparatus of claim 1, wherein the
multilevel signal encoder includes logic configured to, during a symbol period, map a combination of values of the plurality of bitstreams to a combination of voltages on the plurality of multilevel signals and to set the first and second control signals associated with one of the plurality of multilevel signals, for driving the combination of voltages on the plurality of multilevel signals.

4. The apparatus of claim 3, wherein the plurality of bitstreams includes three independent bitstreams, and
wherein a logic circuit of a multilevel signal decoder configured to decode the plurality of multilevel signals to recover the three independent bitstreams comprises:
a first logic circuit that is configured to provide a first of the three independent bitstreams based on a first output signal, a second output signal, a third output signal, and a fourth output signal,
a second logic circuit that is configured to provide a second of the three independent bitstreams based on the first output signal, the second output signal, the third output signal, and the fourth output signal; and
a third logic circuit that is configured to provide a third of the three independent bitstreams based on the first output signal, the second output signal, the third output signal, and the fourth output signal.

5. The apparatus of claim 3, wherein the driver circuit is configured to map sets of three bitstreams to two multilevel signals.

6. The apparatus of claim 5, wherein the logic of the multilevel signal encoder comprises:
a first logic circuit that is configured to provide the first control signal associated with a first multilevel signal of the plurality of multilevel signals, to a first driver of the individual drivers based on values of each of the three bitstreams;
a second logic circuit that is configured to provide the second control signal associated with the first multilevel signal, to the first driver of the individual drivers based on values of each of the three bitstreams;
a third logic circuit that is configured to provide the first control signal associated with a second multilevel signal of the plurality of multilevel signals, to a second driver of the individual drivers based on values of each of the three bitstreams; and
a fourth logic circuit that is configured to provide the second control signal associated with the second multilevel signal, to the second driver of the individual drivers based on values of each of the three bitstreams.

7. The apparatus of claim 3, wherein the driver circuit is configured to map sets of two bitstreams to one multilevel signal using a pulse amplitude modulation architecture.

8. The apparatus of claim 1, wherein the driver circuit includes a switch circuit configured to receive the plurality of bitstreams and provide the plurality of bitstreams to drivers of the individual drivers.

9. The apparatus of claim 1, wherein a first driver of the individual drivers has a first impedance, a second driver of the individual drivers has a second impedance, and the second impedance is half the impedance of the first impedance.

10. The apparatus of claim 1, wherein the driver circuit further comprises a data bus inversion encoder configured to perform a data bus inversion operation on the plurality of bitstreams prior to conversion of the plurality of bitstreams into the plurality of multilevel signals, wherein the data bus inversion operation comprises setting a data bus inversion flag and wherein the conversion of the plurality of bitstreams into the plurality of multilevel signals includes the data bus inversion flag.

11. The apparatus of claim 1, further comprising dynamic random access memory.

12. An apparatus, comprising:
a receiver and decoder circuit configured to receive a plurality of multilevel signals and to decode the plurality of multilevel signals to recover a plurality of bitstreams, wherein a count of the plurality of bitstreams is greater than a count of the plurality of multilevel signals, the receiver and decoder circuit configured to use a pair of reference voltages to determine signal levels of each of the plurality of multilevel signals and to decode the plurality of multilevel signals based on the determined multilevel signal levels, and
wherein the receiver and decoder circuit includes a plurality of pairs of comparators associated with the plurality of multilevel signals, respectively, a first pair of the plurality of pairs of comparators is configured to input a first multilevel signal of the plurality of multilevel signals and to input the pair of reference voltages, and a second pair of the plurality of pairs of comparators is configured to input a second multilevel signal of the plurality of multilevel signals and to input the pair of reference voltages, and wherein only two reference voltages including the pair of reference voltages are used to determine signal levels of each of the plurality of multilevel signals.

13. The apparatus of claim 12, wherein a count of the respective pairs of comparators is based on a count of voltage levels used for transmission of the plurality of multilevel signals, wherein a comparator of each the respective pairs of comparators is configured to compare a voltage of a multilevel signal of the plurality of multilevel signals with a reference voltage among the pair of reference voltages and to provide an output signal based on the comparison.

14. The apparatus of claim 13, wherein the receiver and decoder circuit comprises a multilevel signal decoder that includes logic configured to decode output signals provided by the respective pairs of comparators associated with each of the plurality of multilevel signals to recover the plurality of bitstreams.

15. The apparatus of claim 14, wherein the plurality of bitstreams includes three bitstreams and the plurality of multilevel signals includes two multilevel signals: wherein the respective pair of comparators associated with the first multilevel signal includes a first comparator configured to compare a voltage of the first multilevel signal with a high reference voltage to provide a first output signal and a second comparator configured to compare the voltage of the first multilevel signal with a low reference voltage to provide a second output signal.

16. The apparatus of claim 15, wherein the respective pair of comparators associated with the second multilevel signal includes a third comparator configured to compare a voltage of the second multilevel signal with the high reference voltage to provide a third output signal and a fourth comparator configured to compare the voltage of the second multilevel signal with the low reference voltage to provide a fourth output signal.

17. The apparatus of claim 16, wherein the logic of the multilevel signal decoder comprises:
a first logic circuit that is configured to provide a first of the three bitstreams based on the first output signal, the second output signal, the third output signal, and the fourth output signal;
a second logic circuit that is configured to provide a second of the three bitstreams based on the first output signal, the second output signal, the third output signal, and the fourth output signal; and
a third logic circuit that is configured to provide a third of the three bitstreams based on the first output signal, the second output signal, the third output signal, and the fourth output signal.

18. The apparatus of claim 12, wherein the receiver and decoder circuit comprises a data bus inversion decoder configured to perform a data bus inversion operation on the plurality of bitstreams to generate a decoded plurality of bitstreams.

19. A method, comprising:
converting, by a multilevel signal encoder including a plurality of logic circuits each configured to input a plurality of bitstreams, the plurality of bitstreams into a plurality of multilevel signals at a first device, wherein a count of the plurality of bitstreams is greater than a count of the multilevel signals; and
driving the plurality of multilevel signals onto respective signal lines of an I/O bus to a second device via individual drivers, wherein each of the plurality of multilevel signals is configured to be one of more than two signal levels,
wherein driving the plurality of multilevel signals onto the respective signal lines comprises controlling each of a plurality of sections of a driver associated with one of the plurality of multilevel signals, and
wherein first and second control signals are used to control respective sections of the plurality of sections of the driver associated with one of the plurality of multilevel signals, and each of the first and second control signals is generated based on all of the plurality of bitstreams.

20. The method of claim 19, further comprising performing a data bus inversion operation on the plurality of bitstreams including setting a data bus inversion flag prior to converting the plurality of bitstreams to the plurality of multilevel signals, wherein the plurality of bitstreams after the data bus inversion operation include the data bus inversion flag.

21. The method of claim 19, wherein the first device is a dynamic random access memory device.

22. The method of claim 19, wherein converting the plurality of bitstreams into the plurality of multilevel signals comprises mapping sets of three bitstreams to two multilevel signals.

23. The method of claim 19, wherein converting the plurality of bitstreams into the plurality of multilevel signals comprises mapping sets of two bitstreams to one multilevel signal.

24. A method, comprising:
determining, at a host, voltage levels of each of a plurality of multilevel signals received from a memory; and
decoding the plurality of the multilevel signals based on the determined voltage levels to recover a plurality of bitstreams,
wherein determining the voltage levels of each of the plurality of multilevel signals received from the memory includes comparing a voltage level of a first multilevel signal of the plurality of multilevel signals with a pair of reference voltages to provide a first pair of output signals, and further includes comparing a voltage level of a second multilevel signal of the plurality of multilevel signals with the pair of reference voltages to provide a second pair of output signals, and
wherein only two reference voltages including the pair of reference voltages are used to determine signal levels of each of the plurality of multilevel signals.

25. The method of claim 24, further comprising recovering the plurality of bitstreams based on the respective output signals.

26. The method of claim 24, further comprising performing a data bus inversion operation on the plurality of bitstreams based on a data bus inversion flag included in the plurality of bitstreams to recover a second plurality of bitstreams.

27. The method of claim 24, wherein the plurality of bitstreams includes three bitstreams for every two of the plurality of multilevel signals.

28. The method of claim 24, wherein the plurality of bitstreams includes two bitstreams for every one of the plurality of multilevel signals.

29. The apparatus of claim 1, wherein each logic circuit of the plurality of logic circuits included in the multilevel signal encoder includes at least one logic gate.

30. The apparatus of claim 12, wherein only two reference voltages including the pair of reference voltages are used to determine signal levels of each of the plurality of multilevel signals.

* * * * *